United States Patent [19]

Chia et al.

[11] Patent Number: 5,677,110
[45] Date of Patent: Oct. 14, 1997

[54] ON-PRESS DEVELOPMENT OF AN OVERCOATED LITHOGRAPHIC PLATE

[75] Inventors: Yee-Ho Chia, Lexington, Mass.; Joseph Hanlon, Bradenton, Fla.; John M. Hardin, Jamaica Plain, Mass.; Eugene L. Langlais, Norfolk, Mass.; Rong-Chang Liang, Newton, Mass.; Yi-Hua Tsao; Tung-Feng Yeh, both of Waltham, Mass.

[73] Assignee: Polaroid Corporation, Cambridge, Mass.

[21] Appl. No.: 609,057

[22] Filed: Feb. 29, 1996

Related U.S. Application Data

[63] Continuation-in-part of Ser. No. 430,876, Apr. 28, 1995.
[51] Int. Cl.$^6$ .................................. G03F 7/11; G03F 7/30
[52] U.S. Cl. ................... 430/302; 430/273.1; 430/278.1; 430/276.1
[58] Field of Search ................................. 430/302

[56] References Cited

U.S. PATENT DOCUMENTS

| | | | |
|---|---|---|---|
| 3,753,709 | 8/1973 | Staudenmayer et al. | 96/1.5 |
| 3,753,715 | 8/1973 | Klüpfel et al. | 96/86 P |
| 4,273,851 | 6/1981 | Muzyczko et al. | 430/175 |
| 4,347,289 | 8/1982 | Colegrove | 430/302 |
| 4,408,532 | 10/1983 | Incremona | 101/456 |
| 5,258,261 | 11/1993 | Heller | 430/273 |
| 5,258,263 | 11/1993 | Cheema et al. | 430/308 |
| 5,340,681 | 8/1994 | Sypek et al. | 430/138 |
| 5,348,844 | 9/1994 | Garmong | 430/286.1 |
| 5,368,973 | 11/1994 | Hasegawa | 430/138 |
| 5,395,734 | 3/1995 | Vogel et al. | 430/270.1 |
| 5,506,090 | 4/1996 | Gardner, Jr. et al. | 430/302 |

FOREIGN PATENT DOCUMENTS

0476840A1  3/1992  European Pat. Off. ............ 430/273.1

*Primary Examiner*—Cynthia Hamilton
*Attorney, Agent, or Firm*—Renato M. de Luna

[57] ABSTRACT

The present invention is directed to a method for the on-press development and printing of images. The method generally comprises the steps of providing a lithographic printing plate precursor element comprising a lithographic hydrophilic printing plate substrate, a photohardenable photoresist, and a layer of polymeric protective overcoat; imagewise exposing the precursor element to actinic radiation through said photoresist and overcoat layer sufficiently to photoharden the photoresist in exposed regions and provide a latent image in said photoresist layer; placing the precursor element onto a lithographic printing press; and running the press, whereby printing fluid effects removal of the overcoat and development of said latent image. In particular modes of practices, the method utilizes an overcoat having incorporated therein a water or fountain soluble or dispersible crystalline compound. The overcoat can be used as an oxygen barrier and/or to provide a non-tacky surface on the printing plate. By the incorporation of the crystalline compound, on-press removability of the overcoat is facilitated.

13 Claims, 3 Drawing Sheets

ON-PRESS DEVELOPMENT OF AN OVERCOATED LITHOGRAPHIC PLATE

REFERENCE TO PARENT APPLICATION

This application is a continuation-in-part of U.S. patent application. Ser. No. 08/430,876, filed May 28, 1995, now allowed.

FIELD OF THE INVENTION

The present invention relates to the on-press development of a lithographic plate protected with a non-tacky overcoat, the non-tacky overcoat being at least partially removed on-press.

BACKGROUND

At the present time, virtually all printed copy is produced through the use of three basic types of printing plates. One type is a relief plate which prints from a raised surface. Another type is an intaglio plate which prints from a depressed surface. The third type is a lithographic plate which prints from a substantially flat surface which is neither appreciably raised above nor appreciably depressed below the adjacent and surrounding non-printing areas. Lithographic printing is occasioned by an ink's respective affinity and/or aversion to areas of different chemical properties. Lithographic printing plates are commonly processed to have water-repellent (hydrophobic), oil-receptive (oleophilic) image areas and water-receptive (hydrophilic) non-image areas.

Prior to processing for use, conventional lithographic plates will typically have a hydrophobic, photoreactive polymeric image layer (i.e., photoresist) coated or otherwise deposited atop a hydrophilic substrate.

In preparing a conventional lithographic plate for use on a printing press, the plate is first exposed to actinic radiation. Specific chemical reactions occur in the plate's photoresist by the exposure. Such photoinduced chemical reactions may either reduce or enhance the solubility of the photoresist, depending on whether the resist is negative-working or positive-working. In negative-working plates, exposure to actinic radiation will generally effect a "hardening" of the photoresist. In positive-working plates, exposure to actinic radiation will generally effect a "softening" or solubilization of the photoresist.

After photoexposure, a wet development step is normally conducted. The objective of such wet development is to remove those areas of the photoresist which have undergone photoinduced chemical change or those which have not been photoexposed. Solvation under conventional development techniques will typically involve treating the exposed plate with organic solvents in a developing bath. For negative-working resists, the solvent will swell and dissolve the unexposed portions of the resist. The solvent should not swell the exposed portions or distortion of the developed image may result. For positive-working resists, the response of the unexposed and exposed coatings are reversed, but the same general principles apply.

As a result of the preferential solvation and washing away of portions of the photoresist, corresponding portions of the underlying hydrophilic substrate are uncovered. For negative-working plates, the aforementioned hydrophobic image areas correspond to the portions of the photoresist remaining after solvation and washing. The aforementioned hydrophilic non-image areas correspond to uncovered portions of the substrate. The image and non-image areas thus differentiated, the processed plate may then be mounted onto a printing press and run.

Encumbered by required bath development, the processing of conventional lithographic plates prior to their use on a printing press is both time and labor consuming and involves considerable use of organic chemicals. It will be appreciated that there is a considerable desire for means that would satisfactorily eliminate or reduce conventional lithography's long-felt dependency upon the conduct of bath development and thereby permit use of lithographic plates on a printing press immediately after exposure without required postexposure prepress processing.

Dry developable lithographic printing plates have been suggested which enable the wet processing steps of lithographic printing plates after exposure to be omitted and printing to be conducted by directly mounting the exposed plates on a printing press. Among printing plates that may be characterized as on-press developable (or related thereto) are: e.g., U.S. Pat. No. 4,273,851, issued to Muzyczko et al. on Jun. 16, 1981; U.S. Pat. No. 4,408,532, issued to J. H. Incremona on Oct. 11, 1983; U.S. Pat. No. 5,258,263, issued to Z. K. Cheema, A. C. Giudice, E. L. Langlais, and C. F. St. Jacques on Nov. 2, 1993; U.S. Pat. No. 5,368,973, issued to Hasegawa on Nov. 29, 1994; and U.S. Pat. No. 5,395,734, issued to Vogel et al. on Mar. 7, 1995.

Despite the methodologies and approaches embodied in the aforementioned patents, there is a continuing need for a lithographic printing plate that can be readily developed on a printing press and that produces a plate having durable image areas needed for good run length. Applications for such on-press developable printing plates have been filed.

U.S. patent application Ser. No. 08/147,045 and U.S. Pat. No. 5,514,522, filed by W. C. Schwarzel, F. R. Kearney, M. J. Fitzgerald, and R. C. Liang on Nov. 1, 1993 and Apr. 27, 1995, respectively, describe a photoreactive polymeric binder that may be used to enhance photospeed in either conventional plates or on-press developable lithographic printing plates. Briefly, a polymer of m-isopropenyl-$\alpha,\alpha$-dimethylbenzyl isocyanate is derivatized for vinyl group reactivity by reacting the isocyanate groups thereof with a hydroxyalkyl acrylate, such as 4-hydroxybutyl acrylate. The resulting photopolymeric binder provides higher photospeed than compositions containing non-reactive binders typically utilized in the production of printing plates. Lithographic printing plates utilizing the photoreactive polymeric binder have good durability (as manifested by good runlength) and can be developed using relatively weak developers. As to the preparation of the photoreactive binders, the applications describe a method of copolymerizing m-isopropenyl-$\alpha,\alpha$-dimethylbenzyl isocyanate through complexation with an electron-deficient monomer (e.g., maleic anhydride) to accelerate free radical copolymerization with other monomers. The maleic anhydride accelerated process is kinetically more efficient and provides greater monomer-to-polymer conversion. Use of the resulting product in the photoresist of a lithographic printing plate improves its adhesion. The disclosures of commonly assigned U.S. patent application Ser. No. 08/147,045 and U.S. Pat. No. 5,514,522 are hereby incorporated by reference.

U.S. patent application Ser. No. 08/147,044, filed by F. R. Kearney, J. M. Hardin, M. J. Fitzgerald, and R. C. Liang on Nov. 1, 1993 and resulting in the issuance of U.S. Pat No. 5,607,816, describes the use of plasticizers, surfactants and lithium salts as development aids for negative-working, on-press developable lithographic printing plates. Briefly, plasticizers, which are dispersible or soluble in press fountain solutions and soluble in acrylic monomers and oligomers, are incorporated into a photoresist in relatively high concentrations. Such plasticizers make the photoresist more permeable to fountain solution prior to crosslinking, while being easily extracted with ink and fountain solution after crosslinking. The surfactants facilitate the dispersion of hydrophobic imaging compositions in the fountain solution and reduce scumming. Further, lithium salts may also be incorporated into the photoresist to disrupt hydrogen bonding of, for example, urethane acrylate polymers which tend to associate by hydrogen bonding, thus enhancing developability. The disclosure of commonly assigned U.S. patent application Ser. No. 08/147,044 is hereby incorporated by reference.

U.S. patent application Ser. No. 08/146,479, filed by L. C. Wan, A. C. Giudice, W. C. Schwarzel, C. M. Cheng, and R. C. Liang on Nov. 1, 1993 and resulting in the issuance of U.S. Pat. No. 5,616,449, describes the use of rubbers and surfactants to enhance the durability of on-press developable printing plates. The rubbers are preferably incorporated into a photoresist as discrete rubber particles. To ensure a uniform and stable dispersion, the rubber components are suspended in the photoresist preferably by means of surfactants having HLBs approximately between 7.0 and 18.0. The disclosure of commonly assigned U.S. patent application Ser. No. 08/146,479, is hereby incorporated by reference.

While the practice of the subject matter set forth in the aforementioned applications can produce suitable "on-press" developable printing plates, for certain requirements (e.g., long press runs), the subject matter is desirably combined with that of U.S. Pat. No. 5,516,620, filed by L. C. Wan, A. C. Giudice, J. M. Hardin, C. M. Cheng, and R. C. Liang on Nov. 1, 1993, (commonly assigned and incorporated herein by reference). U.S. Pat. No. 5,516,620 describes a lithographic printing plate for use on a printing press, with minimal or no additional required processing after exposure to actinic radiation. Plate embodiments comprise a printing plate substrate, a polymeric resist layer capable of imagewise photodegradation or photohardening, and a plurality of microencapsulated developers capable of blanket-wise promoting the washing out of either exposed or unexposed areas of the polymeric resist. The microencapsulated developers may be integrated into the polymeric resist layer, or may form a separate layer deposited atop the polymeric resist layer, or—in certain other embodiments—may be coated onto a separate substrate capable of being brought into face-to-face contact with the resist layer.

In various embodiments of the microcapsule-based plates, the microencapsulated developers function as facilitators, promoters, or assists to on-press development. The use of microencapsulated developers thus allows a photoresist to be designed with greater durability, commensurate with the accomplishment of long printing runs. However, the printing of a large number of copies (e.g., 100,000+ impressions) is not always warranted. When a "shortrun" plate (i.e., a plate capable of about 25,000+ impressions) is desired, the plate can be formulated for lessened durability in favor of greater responsiveness to lithographic press fluids. The tradeoff is not inconsequential. While on-press development of these short-run plates can be accomplished without microencapsulated developers, "tackiness" emerges as a concern.

SUMMARY OF THE INVENTION

The present inventors have found that "tackiness" can be countered by depositing onto a press-developable plate a protective, yet on-press removable overcoat. While conventional protective overcoats (e.g., a polyvinyl alcohol barrier layer) can be employed, in the preferred mode of practice, the overcoat is designed to be highly permeable, soluble, or dispersible in printing press fountain or ink solution, such that the overcoat can be more easily removed on-press.

Accordingly, the present application is generally directed toward a method for the on-press development and printing of images from an on-press developable lithographic printing plate, the printing plate being protected with a non-tacky overcoat, the method involving imagewise exposure of the printing plate through the protective overcoat and the subsequent removal thereof on-press. The use of said overcoat provides a protective, non-tacky surface on the on-press developable printing plates.

More particularly, the present invention is directed to a method for printing images on a receiving medium, the method utilizing a printing press, the printing press provided with fountain and ink solutions, the method comprising the steps of: providing a lithographic printing plate comprising a lithographic printing plate substrate having a photoresist thereon, the photoresist capable of being photohardened upon imagewise exposure to actinic radiation; depositing a light-transmissive protective overcoat onto the photoresist; imagewise exposing the photoresist to actinic radiation through the protective overcoat to cause exposed areas of the photoresist to imagewise photoharden; and treating the lithographic printing plate with press fountain and ink solutions on a printing press to cause removal of the overcoat, wherein the press fountain and ink solutions permeate the photoresist to thereby effect removal of unexposed areas of the photoresist, correspondingly baring the underlying substrate, and whereby ink becomes imagewise localized in either unremoved photoresist or bared areas of the substrate to form an imagewise distribution of ink transferable to a receiving medium, such a paper.

In practicing the method, greater advantage will accrue with more efficient on-press removal of the overcoat. Accordingly, it is an object, according to one embodiment of the present invention, to provide a printing plate having a clear, light-transmissive overcoat deposited over a polymeric resist layer, the overcoat having incorporated therein a water or fountain soluble or dispersible crystalline material, whereby the on-press removability of the overcoat is enhanced.

While the benefit of reduced tackiness is accomplished by the use of an overcoat, poor shadow resolution and low contrast are sometimes observed. Poor ink receptability (cf., "ink blinding") on initial press prints is also sometimes observed.

While the applicants do not wish to be bound by any particular explanation, theory, or mechanism, it is believed that loss of resolution and ink receptability can be attributed to such phenomena as (1) intermixing of an overcoat's hydrophilic components with surface of an underlying imaging layer where the components are either physically trapped or chemically bonded to the imaging layer's polymer gel by participating in the photoinduced free radical polymerization and grafting processes occurring in exposed areas; and/or (2) reduced effective oxygen concentration in non-image areas during exposure. Ultimately, however, these effects may be traced to the incidence of undesirable photoreactions in image and/or non-image areas on the printing plate surface. Thus, to broadly control these phenomena where they arise, there is need for deactivating (or otherwise regulating) photoreactions at the surface of a polymeric resist without interfering with photoreactions in remaining areas.

Accordingly, it is still another objective of the present invention to provide a printing plate having a clear, light-transmissive overcoat deposited over a polymeric resist layer, the overcoat having incorporated therein a free-radical regulating system, the free-radical regulating system comprising at least a quencher component, the quencher component capable of deactivating free-radicals subsequent to the activation thereof by exposure to actinic radiation.

DETAILED DESCRIPTION OF THE INVENTIVE SUBJECT MATTER

Figure 1:
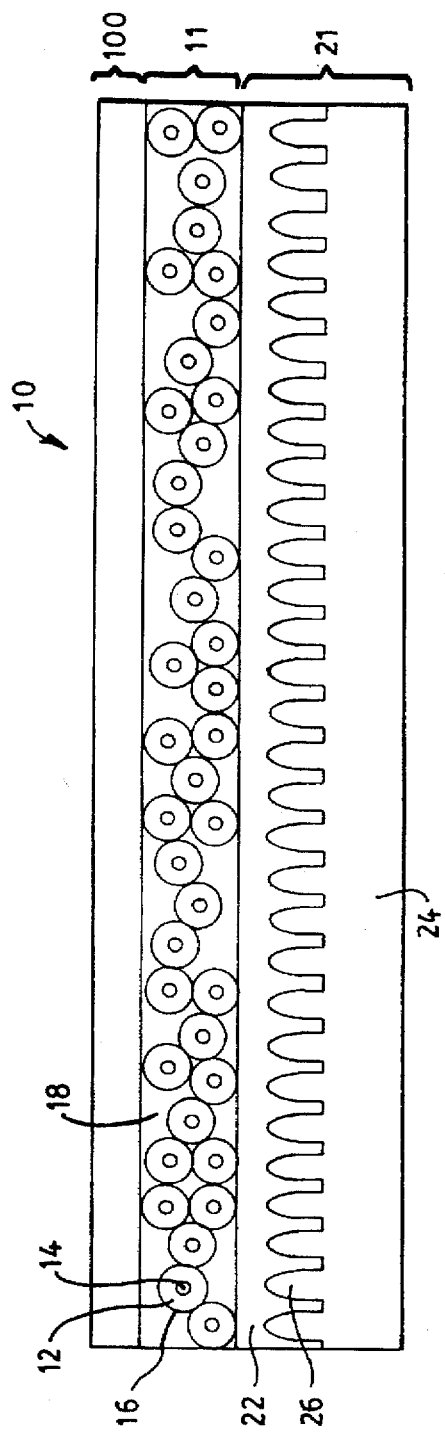
FIG. 1 of the accompanying drawings is a schematic cross-sectional representation of an embodiment of an overcoated lithographic printing plate according to the present invention.

Throughout this disclosure the term "on-press" is used, for example, to describe both development and printing plates, (e.g., "on-press development", "developing on-press", "on-press developable lithographic printing plates", etc.) As used herein, the modifier "on-press"—when directed towards the concept of development—will be defined as indicating an ability to develop a useful imagewise distribution of oleophilic and hydrophobic polymeric areas on a standard printing press after imagewise exposure, without resort to bath development steps or like intermediary processing. (Analogous construction would be correspondingly applicable to the term "on-press removable"). "On-press"development techniques should be contrasted with other so-called "dry development" techniques: e.g., dry collotype and laser ablation techniques, wherein oleophilic and hydrophobic image areas are formed at exposure; and peel-apart and thermal transfer techniques, wherein oleophilic and hydrophilic image areas are formed after a laminar separation.

The present invention provides a method useful for the on-press development and printing of images.

In general, the method comprises the steps of: providing a lithographic printing plate precursor element (i.e., an unexposed and undeveloped lithographic printing plate) comprising a lithographic hydrophilic printing plate substrate, a photohardenable photoresist, and a layer of polymeric protective overcoat; imagewise exposing the precursor element to actinic radiation through the photoresist and overcoat layer sufficiently to photoharden the photoresist in exposed regions and provide a latent image in said photoresist layer; placing the precursor element onto a lithographic printing press; then operating the press such that printing fluids provided therein (e.g., fountain and ink solutions) contact the plate and thereby effect (1) at least partial removal of the overcoat layer and (2) subsequent development of said latent image.

More particularly, the method commences with provision of a lithographic printing plate precursor element overcoated with a non-tacky and light-transmissive polymeric protective layer. While the plate precursor element should be on-press developable, the polymeric protective overcoat can be a conventional overcoat (e.g., a polyvinyl alcohol barrier layer). For significantly better results, however, the polymeric protective overcoat should be configured for immediate or eventual dissolution, dispersion, or permeation by a lithographic printing fluid supplied to said precursor element by means on a printing press for delivering said fluid. In accord with the inventive methodology, the lithographic printing plate precursor element is imagewise exposed to actinic radiation through the photoresist and the overcoat layer sufficiently to photoharden the photoresist in exposed regions and to provide a latent image in said photoresist layer.

Prior to or subsequent to its imagewise exposure, the lithographic printing plate precursor element is mounted (or otherwise placed or positioned) onto a lithographic printing press. The printing press is equipped with the aforementioned means for delivering lithographic printing fluid (e.g., ink and/or fountain solution) to the lithographic printing plate mounted thereon. With the protected precursor element mounted on the printing press, the printing press is operated such that lithographic printing fluid is delivered to the printing plate precursor element bearing said latent image.

During conduct of a printing operation with said precursor element, the delivery of the printing fluid is effected sufficiently to (1) dissolve, disperse, or permeate and remove the overcoat layer (preferably, in a non-imagewise manner), and (2) permeate and remove from the precursor element non-exposed regions of the photoresist layer, thereby baring the hydrophilic surface of said printing plate substrate, while exposed and photohardened ink-receptive regions of said photoresist remain on the substrate.

After development of the precursor element, operation of the printing press is continued. Lithographic ink delivered by the supply means becomes imagewise localized in the imagewise-exposed, photohardened regions of the photoresist, and is ultimately transferred to a receiving element (e.g., paper).

In practicing the inventive methodology, the polymeric protective overcoat (structure 100 in FIGS. 1, 2, and 5) is configured as a non-tacky, light-transmissive overcoat. A desirable overcoat would function as a barrier to atmospheric oxygen, retarding the inhibition effects of atmospheric oxygen on the photopolymerization of the photoresist when the plate is exposed, for example, either in a standard vacuum frame exposure device or in a non-vacuum frame exposure device (for example a Rachwal or other projection exposure device). The polymeric protective overcoat comprises at least a water or fountain soluble or dispersible polymer.

As noted above, the polymeric protective overcoat can be a conventional oxygen barrier layer. Notwithstanding, better and more acceptable results are obtained by configuring the overcoat to be readily "on-press removable". In preferred embodiments, on-press removability is advanced by the incorporation into the overcoat of a fountain soluble or dispersible crystalline compound, which diminishes or otherwise effects a reduction in the overcoat's structural integrity when treated on-press.

Examples of suitable fountain soluble or dispersible crystalline compounds include: sucrose, glucose, lactose, saccharides, polysaccharides, and their derivatives; salts of organic acids such as acetic acid, propionic acid, butyric acid, iso-butyric acid, malonic acid, and glutaric acid (e.g., sodium glutarate); salts of organic acids, especially alpha-hydroxy acids, such as glycolic acid, lactic acid, glyceric acid, malic acid, tartaric acid, and citric acid (e.g., sodium citrate, a poly-hydroxy material); salts of other organic acids such as beta, gamma or delta-hydroxy acids; salts of derivitized organic acids such as sulfonic, sulfuric, phosphonic, phosphoric and like acids, especially hydroxy acids such as pentaerythritol-di-phosphoric acid, hydroxy-styrene-sulfonic acid, sorbitol-phosphoric acid, and glycero-phosphoric acid (e.g., sodium glycero-phosphate); salts of acids derived from saccharides such as xylaric acid, galactaric acid, glycharic acid, mannaric acid, saccharic acid, and gluconic acid (e.g., sodium gluconate); mixtures of acid salts with carbohydrates such as sorbitol, mannitol, arabinose, xylose, and maltose. Salts of organic acids can be formed with alkaline metals (such as sodium, potassium, and lithium), or with ammonium or with amines (alcohol-amines and the like, e.g., triethanolamine). The compound (or combinations thereof) are incorporated into an overcoat formulation preferably at a low concentration (approximately 2 to 6% by weight).

In general, crystalline compounds that are highly compatible with printing press fountain and ink chemistry—such as those listed above—are good candidates for the overcoat. However, "hydroxy" and "polyhydroxy" materials are desirable because they dissolve readily in fountain solution and, in the course thereof, produce acid salt derivatives. These derivatives tend to protect the plate's background areas and prevent "scumming" and corrosion.

While the present inventors do not wish to be bound to any theory in explanation of their invention, in the preferred modes of practicing the present invention, it is believed that the crystalline compounds form microcrystals in the dried overcoat. When the plates are developed on-press, the microcrystals rapidly dissolve in the fountain solution, leaving behind numerous microvoids, fissures, pores, or the like, which facilitate penetration of fountain and ink through the overcoat.

Other ingredients, such as a surfactant and a second water-soluble polymer, may provide additional advantages when incorporated into the overcoat. Examples of suitable "second" polymers include but are not limited to polyvinyl alcohol, polyvinyl alcohol copolymers, acrylic ester polymers and copolymers, hydroalkyl cellulose and its derivatives, gum arabic, and gelatin. A low to medium molecular weight, partially hydrolyzed polyvinyl alcohol is preferred. Regarding surfactants, nonionic varieties having an HLB value between 10 and 14 are desirable.

A desirable formulation for an overcoat would include: 1 to approximately 100% (preferably 10 to 50%) by dry weight of a water soluble polymer bearing a quencher functionality (see below); 0% to approximately 99% (preferably 30 to 80%) by dry weight of a second water soluble polymer such a polyvinyl alcohol, gum arabic, and hydroxyalkyl cellulose; 0% to 10% (preferably 2 to 6%) by dry weight of a readily water soluble crystalline compound such as sucrose, glucose, lactose, saccharides, polysaccharides, and their derivatives; and 0% to approximately 15% (preferably 2 to 8%) by dry weight of surfactants, preferably a combination of at least a nonionic surfactant and an anionic surfactant.

While the overcoat is preferably configured as a fountain soluble or dispersible polymeric layer, other configurations are contemplated.

For example, an overcoat can be made from a solvent-coated oleophilic polymer. Such organic overcoat could be designed to be readily soluble in printing press ink, in which case, removed remnants of the overcoat will be "taken up" by the press ink, thus reducing pollution of the fountain solution.

Alternatively, the overcoat can be configured as an emulsion, for example, oleophilic polyurethane particles dispersed in a hydrophilic polyvinyl alcohol matrix. Here, removability is occasioned by permeation of fountain solution through the emulsion overcoat, solubilizing unexposed areas of the underlying photoresist, and thereby "undercutting" the overlying overcoat. Depending on its particular configuration, an emulsion-type overcoat may manifest marked hydrophobicity (as opposed to the hydrophilicity of the aforediscussed preferred overcoats). Accordingly, the effect on the printed image of residual overcoat material remaining on exposed photohardened image areas would be inconsequential to its operability.

Aside from its function as a non-tacky coating, the overcoat, by inclusion therein of a quencher component, can function as a means whereby photoexcited reactants (e.g., free-radicals) in the "intermix" zone between the image coat (i.e., polymeric photoresist) and the overcoat, can be deactivated or otherwise regulated. Using such quencher component effects good resolution, ink receptability, and shelf-life.

In the case of photoreactions based on free-radical mechanisms, the preferred examples of quencher components are polymers having covalently bonded or otherwise derivatized thereon stable aminoxy free-radical groups such as TEMPO (2,2,6,6-tetramethyl-1-piperidinyloxy), PROXYL (2,2,5,5-tetramethyl-1-pyrrolidinyloxy), or DOXYL (4,4-dimethyl-3-oxyyazolinyloxy), and other like free-radical "traps". For example, the highly efficient, free radical trap functionality of a stable piperidyloxy, free radical TEMPO, may be incorporated by using the 4-amino-, 4-hydroxy-, or 4-keto- substituted methacryloyl chloride, glycidyl acrylate (epoxy), glycidyl methacrylate, vinylazolactone, m-isopropenyl-α,α-dimethylbenzyl isocyanate, 2-isocyanatoethyl methacrylate, styrene sulfonyl chloride, and amine or hydrazide in the case of 4-keto-TEMPO. Other stable aminoxy, free radical groups such as PROXYL or DOXYL derivatives may be used instead of TEMPO, as well as other functionalities capable of equivalently serving as free radical traps, inhibitors, or retarders, such as oxime, phenol, nitro, nitroso, nitrone, hydroxamic acid, and amidoxime.

In presently preferred formulations, the water-soluble polymeric quencher has the formula:

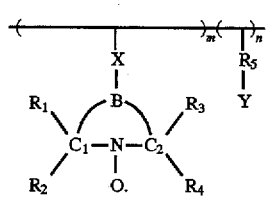

wherein, $R_1$, $R_2$, $R_3$, and $R_4$ are hydrogen or preferably lower alkyl groups having from 1 to 5 carbon atoms, B is an alkylene group having 2–3 carbon atoms and forming a heterocyclic ring with a first and a second carbon molecule, $C_1$ and $C_2$, respectively; and X is a connecting linkage (e.g., an amide, urethane, ester, ether, urea, or more preferably, a chain extended linkage) connecting the heterocyclic ring to the polymer's backbone, $R_5$ is an alkyl or an aryl, and Y is a functional group (such as sulfate, sulfonate, phosphate, or quarternary ammonium salts) capable of altering the polymer's physical properties (such as solubility). Such polymer—functioning as a quencher component—is capable of deactivating the free-radical based photocuring system, particularly in the intermix zone between the overcoat and the polymeric resist layer. In this manner, the lithographic printing plate is provided with a system for regulating free-radicals therein.

Free-radical trapping polymers can be prepared by reacting 4-amino TEMPO (4-amino-2,2,6,6-tetramethyl-1-piperidinyloxy) and 2-aminoethyl sulfonic acid with EMA copolymer to give TEMPO and sulfonate substituted copolymers. Such process can be represented by the following chemical reaction (Synthesis Scheme I):

by weight; n is from approximately 0% by weight to approximately 75% by weight; o is from approximately 0% by weight to approximately 5% by weight; and p is from approximately 0% by weight to approximately 5% by weight. These sulfonate substituted copolymers are soluble or dispersible in fountain solutions (pH 4–6) typically found in printing presses. While sulfonate is not critical to the above reaction, it will be appreciated that non-sulfonate substituted copolymers are less soluble. Other strong acid substituents such as sulfate also improve solubility at these lower pHs. The sulfate or sulfonate group also reduces the degree of intermixing of the overcoat with components of the image layer, because of its low solubility in the formulation from which the resist layer is prepared.

In Synthesis Scheme I, the synthesis of EMA-ASA-TEMPO is believed to result in the generation of certain ionic species: i.e., ammonium TEMPO, ammonium sulfonate, and hydrolyzed ethylene-maleic acid. When present in a polymeric quencher formulation used in making an overcoat, these ionic species can potentially contribute to free-radical regulation effected by use of said overcoat, i.e., the ionic species function as quenchers.

As an alternative to synthesis directly involving 4-amino TEMPO, equivalent if not identical copolymers may be manufactured by reacting 4-amino-2,2,6,6-tetramethylpiperidine and 2-aminoethyl sulfonic acid (ASA) with poly(ethylene)-co-(maleic anhydride) (EMA) in water, followed by oxidation. The process is represented by the following chemical reaction (Synthesis Scheme II): Scheme II):

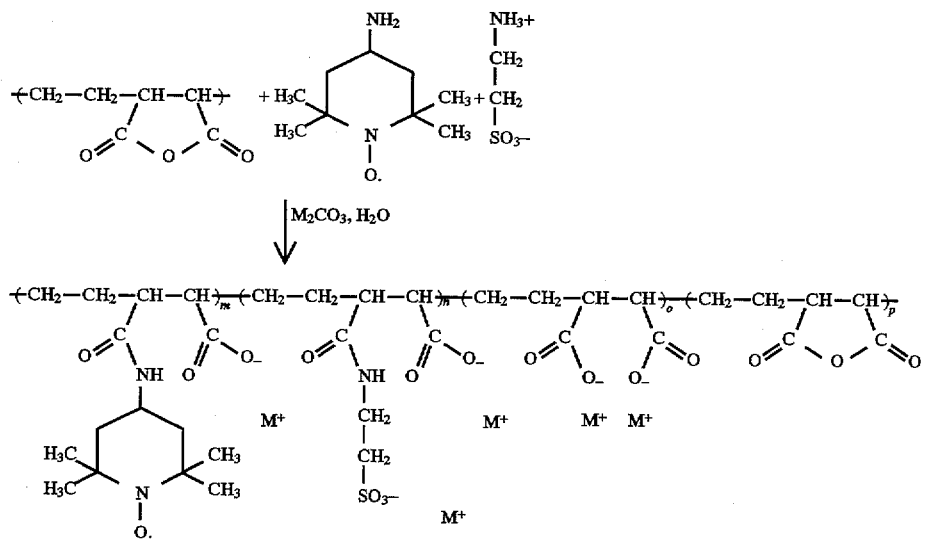

In the above reaction, M is a cation producing atom; m is from approximately 20% by weight to approximately 90%

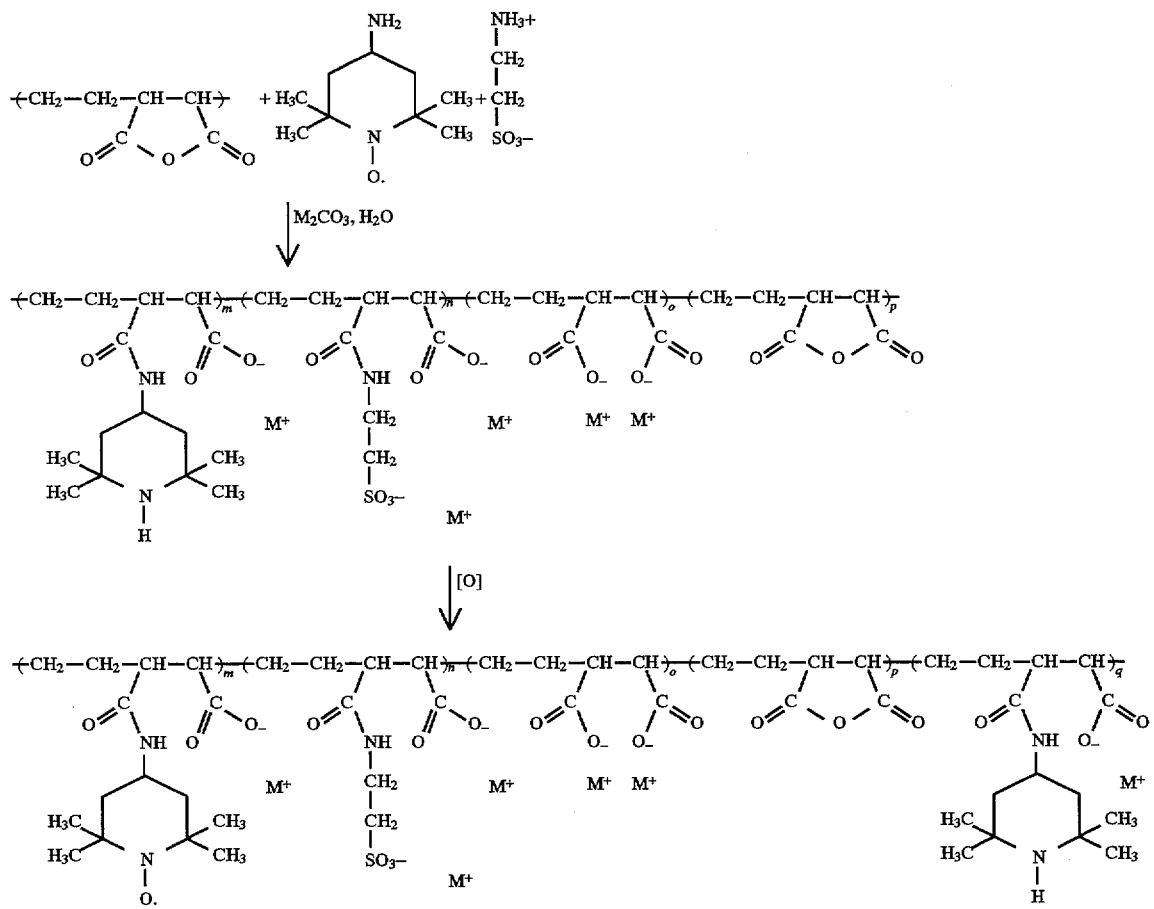

In the above reaction, M is a cation producing atom; m is from approximately 20% by weight to approximately 95% by weight; n is from approximately 0% by weight to approximately 75% by weight; o is from approximately 0% by weight to approximately 5% by weight; p is from approximately 0% by weight to approximately 5% by weight, and q is 0% to approximately 50% by weight.

While the aforediscussed polymeric quenchers are presently preferred, alternatives and equivalents are contemplated.

Examples of alternative free-radical quenching polymers would include polyvinyl alcohol derivatized with 4-isothiocyanatoTEMPO, 4-bromoacetamidoTEMPO, 3-bromoacetamidomethylPROXYL, bromoalkyl ester of 4-hydroxyTEMPO, 3-isothiocyanatomethylPROXYL, aldehyde-TEMPO, or gentisaldehyde; a cellulosic polymer derivatized with 4-isothiocyanatoTEMPO, 4-bromacetamidoTEMPO, or 3-bromacetamidomethylPROXYL; 4-hydroxyTEMPO derivatized onto reactive copolymers such as polyglycidyl copolymers, polymethacryloyl chloride, isocyanato ethyl methacrylate copolymers, isopropenyl-α,α-dimethylbenzyl isocyanate copolymers, or polyvinylbenzyl bromide (followed by quaternization of unreacted bromides); 4-aminoTEMPO derivatized onto maleic anhydride copolymers such as maleic anhydride-co-methyl vinyl ether; maleic anhydride-M-polyetheyleneglycol allyl ether; maleic anhydride-co-vinylpyrrolidone, or an imide of maleic anhydride-co-vinylpyrrolidone; ethylene-maleic acid (EMA) derivatives such as an imide of EMA-ASA-TEMPO; or EMA-ASA-3-methylPROXYL, or an imide of EMA-ASA-3-methylPROXYL; ionically immobilized TEMPO, PROXYL, or DOXYL (e.g., EMA-ASA$^-$ $^+$ammoniumTEMPO, and polystyrene sulfonate$^-$ $^+$ammoniumTEMPO); polymeric oximes such as polydiacetone acrylamide oxime-co-AMPS (acrylamido-2-methyl-1-propanesulfonic acid); polyacryloyl hydroxamic acid; polyacrylamidoxime; copoly (4-acrylamidoTEMPO); copoly (4-acryloxyTEMPO); copoly (4-glycidoxyTEMPO); polymeric phenols such as poly(vinylphenol)-co-(4-styrene sulfonate, sodium salt); polymeric thiazolidines; and polymeric chain extended TEMPO such as the oxidized product of ethylene-maleic acid and N-2,2,6,6-tetramethyl-4-piperidinyl-N-aminooxamide.

Equivalents to the free redical quenching polymer would include acid quenching polymers (e.g., polyethylenimine, poly (2-vinylpyridine), poly (4-vinylpyridine), poly (2-dimethylaminoethyl acrylate), 4-amino-2,2,6,6-tetramethylpiperidine and 2-aminoethyl sulfonate, substituted poly (ethylenemaleic acid, sodium salt) EMA-ASA-TEMPO, TEMPO and 2-aminoethyl sulfonate substituted poly-(ethylene-maleic acid, sodium salt) EMA-ASA-TEMPO, poly (4-glycidyloxyTEMPO); and base quenching polymers (e.g., acrylic acid copolymers, aqueous acidic latices such as described in U.S. Pat. No. 5,427,899).

Regarding connecting linkage, X, in the aforedescribed formula of a polymeric quencher, comparably better quenching efficiency has been observed wherein a longer linkage (e.g., a chain-extended linkage) was utilized to extend the quenching functional group further away from the polymeric backbone and the possible steric hindrance effected thereby. A suitable compound useful toward this end is N-2,2,6,6-Tetramethyl-4-Piperidinyl-N-Aminooxamide (available from Elf Atochem North America, Inc., under the tradename Luchem HA-R100). In a slight modification to the syntheses described immediately below, such compound can be used to derivatize an EMA copolymer, then oxidized to form an N-Oxide radical.

Practice of the present invention is not limited by the configuration of the underlying lithographic printing plate. Several varieties of overcoated plates are envisioned; some are represented in the FIGURES.

Figure 3:
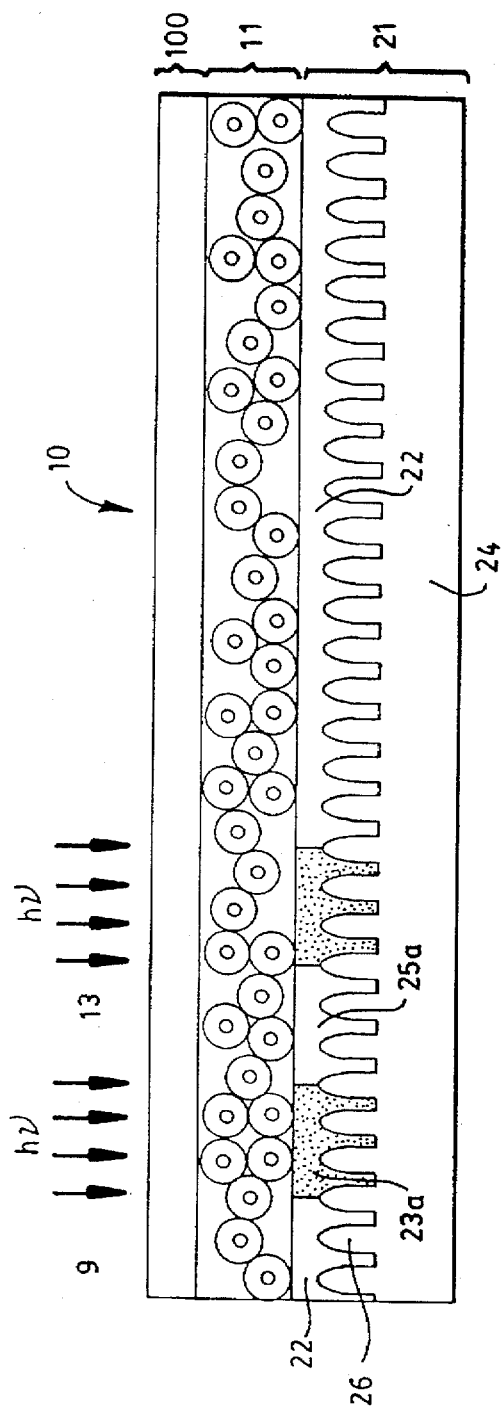
FIG. 3 is a schematic cross-sectional representation of the overcoated lithographic printing plate embodiment illustrated in FIG. 1 shown with the plate being exposed to actinic radiation (hv) through non-tacky overcoat 100 and photoresist 22.

One plate configuration, an overcoated dual-layer lithographic printing plate 10, is schematically illustrated in FIG. 1. As drawn (not to scale), overcoated dual-layer printing plate 10 comprises a plate layer 21, a microcapsule layer 11, and a continuous, light-transmissive overcoat 100. Plate layer 21 comprises a suitable printing plate substrate 24 and a polymeric photoresist layer 22. In general, polymeric resist layer 22 comprises a photopolymerizable ethylenically unsaturated monomer, a macromolecular organic binder, and a free-radical generating, addition-polymerization initiating system. Microcapsule layer 11, layered atop plate layer 21, comprises a plurality of microcapsules 16 contained in a binder matrix 18. Each of the microcapsules 16 comprises an outer shell phase ("shell") 12 and an internal encapsulant phase ("core") 14. Exposure of overcoated dual-layer printing plate is shown in FIG. 3.

As illustrated in exaggerated fashion in FIG. 1, an upper surface of substrate 24 may be provided with a plurality of grains ("graining") 26 obtained by several processes discussed in further detail below. As will be noted, and which will also be discussed in further detail below, polymeric photoresist layer 22 is coated onto substrate 24 above the microstructure of the grains 26, the microstructure being shown in FIG. 1 in exaggerated fashion. It is noted that in some cases, a water-soluble release layer (not shown) between the substrate 24 and the resist layer 22 may also be employed to enhance the performance of the lithographic plate.

Another plate configuration, an overcoated pseudo-mono-layer lithographic printing plate 30, is initially prepared by a single-pass coating process from a coating composition comprising dispersed microcapsules, a photosensitive resist composition, and solvents. Since the initial coating process involves only a "single-pass", it is believed that the underlying pseudo-mono-layer can be more easily manufactured at a cost less than that of the dual layer of printing plate 10.

Figure 2:
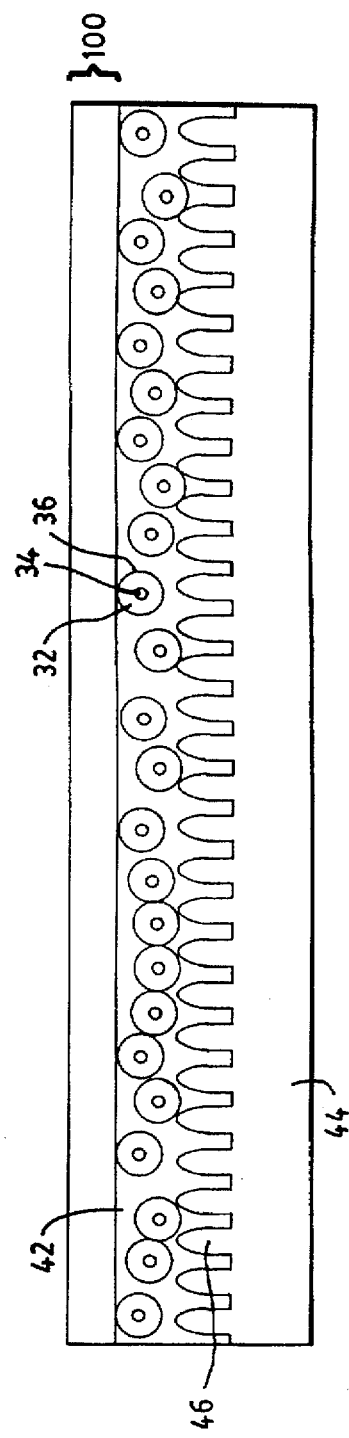
FIG. 2 is a schematic cross-sectional representation of another embodiment of an overcoated lithographic printing plate according to the present invention.

Overcoated pseudo-mono-layer lithographic printing plate 30 is schematically illustrated in FIG. 2. As drawn (not to scale), overcoated pseudo-mono-layer printing plate 30 comprises a substrate 44 and a free-radical activatable polymeric resist layer 42 having a plurality of microcapsules 36 interspersed therethrough. The microcapsules 36 of the mono-layer printing plate 30 comprise an outer shell phase ("shell") 32 and an internal encapsulant phase ("core") 34. As with the overcoated dual-layer printing plate 10, overcoated pseudo-mono-layer printing plate 30 further comprises a continuous, light-transmissive overcoat 100.

While the present invention will find utility in microcapsule-based on-press developable lithographic printing plates as described in U.S. patent application Ser. No. 08/146,710, it will be understood that a continuous, light-transmissive overcoat may be employed to potential advantage on any conventional lithographic printing plate, and with greater more apparent advantage, on on-press developable printing plates, such as described in U.S. patent application Ser. Nos. 08/147,044, 08/146,479, 08/147,045, and 08/146,711. With regard to the latter, when employing an overcoat according to the inventive methodology, a pre-exposed, pre-hardened photoresist in an on-press developable printing plate can be configured to be highly fountain permeable, soluble, swellable, or dispersible: The "tackiness" of the resultant plate (and problems associated therewith) are countered by the provision of the non-tacky overcoat.

Figure 5:
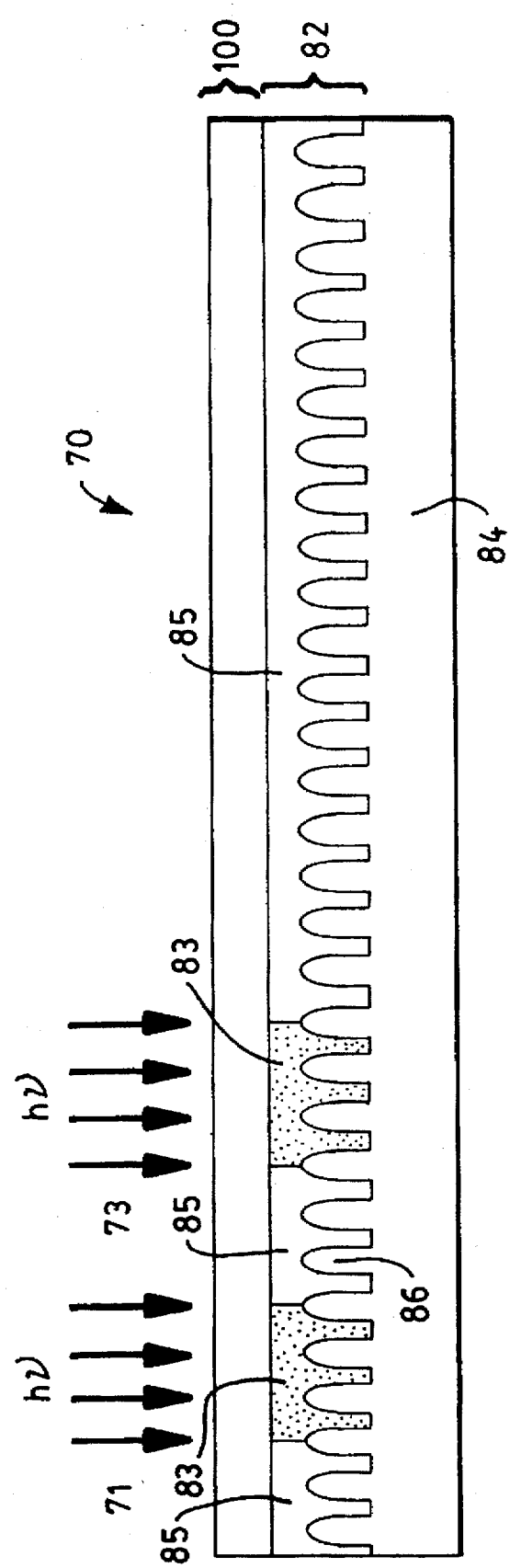
FIG. 5 is a schematic cross-sectional representation of photoexposure of either a conventional plate, or a fountain swellable or permeable on-press developable printing plate (such as those discussed in U.S. patent application Ser. Nos. 08/146,479; 08/147,044; 08/147,045; and 08/146,711), the plate having deposited thereon an overcoat 100. The overcoated plate is shown at imagewise exposure with actinic radiation (hv) directed through non-tacky overcoat 100 and photoresist 82.

For example, with reference to FIG. 5, the inventive methodology described herein can find applicability to an overcoated lithographic printing plate 70 comprising a substrate 84 (advantageously grained, i.e., structure 86), an on-press developable photohardenable polymeric resist 82 (preferably prepared in the manner described in U.S. patent application Ser. Nos. 08/147,044, 08/146,479, 08/147,045, and/or 08/146,711), and a continuous light-transmissive overcoat 100.

The embodiment represented by FIG. 5 does not incorporate secondary means for advancing or promoting on-press developability (i.e., microencapsulated developers). Regardless, after exposure of portions 83 of resist 82 by actinic radiation 71 and 73, the present invention calls for the on-press development of the overcoated plate without any further treatment—such as off-press removal of overcoat 100. Development and removal of the overcoat is accomplished on the printing press by the action of fountain solution and lithographic ink.

Figure 4:
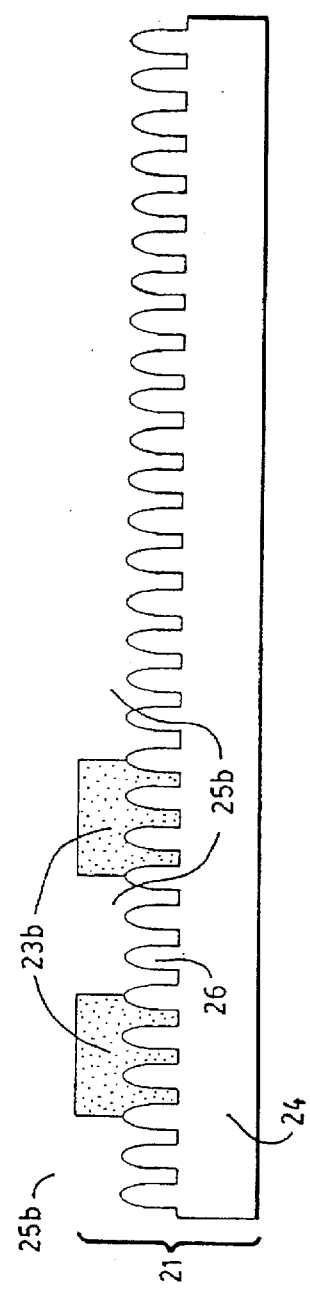
FIG. 4 is a schematic cross-sectional representation of a lithographic printing plate (e.g., FIGS. 1, 2, or 5) after on-press overcoat removal and on-press image development, conducted in accordance with method aspects of the present invention. (For simplicity, reference numerals are provided only with regard to the plate configuration shown in FIG. 1.)

In particular, using for example the methods of offset lithography, the overcoated printing plate 70 can be mounted on a plate cylinder of a printing press which, as it rotates, comes into contact successively with rollers wet by a fountain solution and rollers wet by ink (cf., the aforementioned "fluid delivery means"). The fountain and ink solution (sprayed or otherwise deposited onto dampening rollers and inking rollers, respectively) contacts the plate, leading to the aforediscussed interaction of the fountain and ink solutions with the overcoat and the photoresist. Ultimately—after press removal of at least a portion of the overcoat (see FIG. 4)—the fountain solution contacts the non-printing areas of the plate and prevents ink from contacting these areas. The ink likewise contacts the image areas and is subsequently transferred to an intermediate blanket cylinder. The inked image is then transferred to the receiving medium (e.g., paper) as the medium passes between the intermediate blanket cylinder and an impression cylinder.

It is noted that practice of the inventive methodology claimed herein calls for the use of a polymeric ink-receptive photoresist capable of being photohardened upon imagewise exposure to actinic radiation. While the steps of the method can be performed with photoresists of several and varying configurations, the polymeric photoresist layer in the presently contemplated and preferred embodiments—as implied above—are of the "on-press" variety. Accordingly, the polymeric photoresist layer is configured such that—following the imagewise exposure thereof—non-photohardened regions (i.e., non-exposed regions) are removable on-press, such as by, for example, dissolution, dispersion, or by the permeation and undercutting thereof by lithographic printing fluid. Several configurations and strategies by which an on-press developable lithographic plate can be provided are set forth in the aforementioned U.S. patent application Ser. Nos. 08/146,479, 08,147,044, 08/147,045, 08/146,711, and U.S. Pats. Nos. 5,516,620, 5,561,029, 5,599,650 4,273,851, 4,408,532, 5,358,263, 5,368,973, and 5,395,734.

Regardless of the particular additives, components, or configuration of polymeric photoresist layer that account for the layer's on-press developability, certain ingredients common in conventional lithographic photoresists will in general also be present in most on-press developable lithographic plates. For example, a polymeric photoresist layer suitable for on-press development will generally include a macromolecular organic binder, a photopolymerizable ethylenically unsaturated monomer, and a photoinitiator, these ingredients being suitably coated into a layer which, upon photoexposure, undergoes insolubilization or hardening as the result of polymerization of the polymerizable monomer and grafting of the monomer onto the polymeric binder.

In general, photosolubilization or photohardening of the polymeric resist layer during exposure can be effected by including therein any variety of compounds, mixtures, or mixtures of reaction compounds or materials capable of being photopolymerized, photocrosslinked, photorearranged, or of promoting hardening of the layer in areas of photoexposure. Compounds and materials suitable for this purpose include, but are not limited to, monomeric photopolymerizable compounds which undergo free-radical initiated photocuring. Also suitable are macromolecular or polymeric compounds having pendant groups, such as ethylenically unsaturated groups which promote crosslinking or hardening upon photoexposure or other reactive, e.g., cinnamate, groups which promote hardening by crosslinking or photodimerization.

Especially preferred for promoting photohardening of polymeric resist layer is a polymerizable monomer which forms a macromolecular or polymeric material upon photoexposure, preferably a photopolymerizable ethylenically unsaturated monomer having at least one terminal ethylenic group capable of forming a polymer by, for example, free-radical initiated, chainpropagated addition polymerization. Examples of such photopolymerizable ethylenically unsaturated monomers generally include acrylates, acrylamides, methacrylates, methacrylamides, alkyd compounds, vinyl ethers, vinyl esters, N-vinyl compounds, styrene, crotonates, and the like. Particularly suitable photopolymerizable ethylenically unsaturated monomers include the difunctional, trifunctional and polyfunctional acrylates, such as the aforementioned acrylate and methacrylate esters of polyhydric alcohols (e.g., pentaerythritol triacrylate and trimethylolpropane triacrylate). Other suitable monomers include ethylene glycol diacrylate or dimethacrylate or mixtures thereof; glycerol diacrylate or triacrylate; and the ethoxylates thereof. Also useful are oligomeric polyester diol diacrylate, polyether diol diacrylate, and other acrylated oligomeric polyols. Polyfunctional vinyl ethers and epoxy monomers or oligomers are also very useful when cationic photoinitiators such as diaryl iodonium and triaryl sulfonium salts are employed.

The principal component of polymeric resist layer for most plates is a polymeric binder which provides a hydrophobic layer of suitable oleophilicity and ink receptivity. Suitable macromolecular binder materials include: vinylidene chloride copolymers (e.g., vinylidene chloride/acrylonitrile copolymers, vinylidene chloride/methylmethacrylate copolymers and vinylidene chloride/vinyl acetate copolymers); ethylene/vinyl acetate copolymers; cellulose esters and ethers (e.g., cellulose acetate butyrate, cellulose acetate propionate, and methyl, ethyl benzyl cellulose); synthetic rubbers (e.g., butadiene/acrylonitrile copolymers; chlorinated isoprene and 2-chloro-1,3-butadiene polymers); polyvinylesters (e.g., vinyl acetate/acrylate copolymers, poly(vinyl acetate) and vinyl acetate/methylmethacrylate copolymers); acrylate and methacrylate copolymers (e.g., polymethylmethacrylate); vinyl chloride copolymers (e.g., vinyl chloride/vinylacetate copolymers); and diazo resins such as the formaldehyde polymers and copolymers of p-diazo-diphenylamine.

Photopolymerization can be effected by using a free-radical generating photocuring system activatable by actinic radiation. A free-radical generating photocuring system may comprise a photoinitiator, and optionally, sensitizers and coinitiators. Among useful photoinitiators and coinitiators are butyl benzoin ether, isobutyl benzoin ether, ethyl benzoin ether, propyl benzoin ether, benzophenone, benzil ketals, benzoin, acetophenone (such as 2,2-dimethoxy-2-phenylacetophenone), dimethyl quinoxiline, 4,4'-bis (dialkyllamino) benzophenone, ketocoumarin (such as 3-benzoyl-7-methoxy coumarin), xanthone, thioxanthone, alkyl-substituted anthraquinone, diaryl iodonium salt, triaryl sulfonium salts, azobisisobutyro nitrile, azo-bis-4-cyanopentanoic acid, bistrichloromethyltriazine and its derivatives, and the like. Such initiators may be used singly or in combination. Useful photosensitizers are those that have strong UV absorption characteristics at a longer wavelength, and that are capable of exciting the initiator through an electron transfer reaction, for example, ITX (a mixture of 2- and 4- isomers of isopropyl thioxanthone, available from Biddle-Sawyer), and CPTX (1-chloro-4-propoxythioxanthone-1-chloro-4-propoxy-9H-thioxanthone-9-one, also available from Biddle-Sawyer), ketocoumarin derivative, and Micheler's Ketone and its derivatives.

Also suitable photosensitive components are preformed polymers which contain pendant reactive groups which are altered by photoexposure or which promote a change in the physical properties of layer upon photoexposure. Such reactive groups include those which undergo rearrangement, cycloaddition, insertion, coupling, polymerization or other reactions. Preferred polymers are those having pendant ethylenically unsaturated moieties which can be crosslinked by irradiation, using a photoinitiator or a photosensitizer. Preformed polymers having pendant crosslinkable groups include, for example, the reaction product of a hydroxyl-containing polymer (e.g., a polyester of a dicarboxylic acid and a polyhydric alcohol) and a vinyl monomer containing isocyanate groups (e.g., isocyanatoethyl acrylate or methacrylate). As to such reaction product, cross-linking agents and photoinitiators can be used to provide a cross-linked polymer having urethane linkages, thus contributing to the photohardening of the polymeric resist layer. See, e.g., U.S. patent application Ser. No. 08/147,045 and U.S. Pat. No. 5,514,522. Along similar lines, if desired, preformed polymers having pendant reactive groups such as cinnamate groups can also be used. For example, polyvinyl cinnamate formed by the esterification of hydroxyl groups of polyvinyl alcohol using cinnamic acid or cinnamoyl chloride, can be used to promote crosslinking by photodimerization of cinnamoyl groups. Preformed polymers having pendant pyridium ylide groups, which groups, upon photoexposure, undergo ring expansion (photorearrangement) to a diazepine group with accompanying insolubilization can also be used. Examples of polymers having such groups are set forth in U.S. Pat. No. 4,670,528 (issued Jun. 2, 1987 to L. D. Taylor, et al.)

Photoexposure of the printing plates can be accomplished according to the requirements dictated by the particular composition of layer polymeric resist layer and the thickness thereof. In general, actinic irradiation from conventional sources can be used for photoexposure, for example, relatively long wavelength ultraviolet irradiation or visible irradiation. UV sources will be especially preferred and include carbon arc lamps, "D" bulbs, Xenon lamps, and high pressure mercury lamps.

The thickness of the photoresist layer can vary with the particular requirements. In general, it should be of sufficient thickness to provide a durable photohardened printing surface. Thickness should be controlled, however, such that it can be exposed within exposure-time requirements and should not be applied at a thickness that hampers ready removal of the layer in non-exposed areas by developers. Good results are obtained by using a polymeric resist layer having a thickness in the range of from about 1 micron below to about 1 micron above the grain (preferably 0.5 microns below the grain to about 0.3 microns above the grain). On a coat weight basis, the preferred coverage of the photoresist layer is about 70 to 150 mg/ft$^2$, depending on the grain structure.

Polymeric resist layer can be provided with colorants, e.g., tint dyes, to provide a desired and predetermined visual appearance. Especially preferred will be a colorant, or a precursor of a species, respectively, capable either of being rendered colorless, or being provided with coloration by the irradiation of the plate-making photoexposure step. Such dye or dye-precursor compounds and the light absorption differences promoted by the photoexposure allow the platemaker to distinguish readily the exposed from the non-exposed regions of the plate in advance of placing the photoexposed plate onto a printing press for the conduct of a printing run.

In addition, the operability of the photoresist layer may be improved by the addition of certain additives. For example, polymeric resist layer can contain plasticizers, photosensitizer or catalysts appropriate to the particular photoactive compound or system employed, hardeners, or other agents to improve coatability. Polymeric resist layer may also contain antioxidant materials to prevent undesired (premature) polymerization and examples include derivatives of hydroquinone; methoxy hydroquinone; 2,6-di-(t-butyl)-4-methylphenol; 2,2'-methylene-bis-(4-methyl-6-t-butylphenol); tetrakis {methylene-3-(3',5',-di-t-butyl-4'-hydroxyphenyl)propionate} methane; diesters of thiodipropionic acid, triarylphosphite. It is noted however that the use of such additives is not necessary for the operability of the present invention. However, incorporation of such additives may dramatically enhance performance. It is also noted that such plasticizers, contrast dyes, imaging dyes and other additives may also be included in microcapsules. Inclusion in microcapsules provides a wider latitude in the selection of such additives, since neither the solubility of the additives in the photopolymerizable compositions nor the inhibition or retardation effect of some additives on polymerization would be an issue in such a system.

It will be appreciated that the components of the photoresist should be selected in consideration of compatibility with press ink solution and the desirability of maintaining the fountain/ink balance of the fluid press environment. When plates according to the present invention are developed on-press, advantage is achieved by the uptake of "removed" photoresist areas (and overcoat 100, if any) by press ink away from the fluid press environment and their subsequent deposition onto the initial units of receiving media.

In practice, substrate materials for use in the manufacture of printing plates will oftentimes be subjected to one or more treatments in order to improve adhesion of a photosensitive coating, or to increase the hydrophilic properties of the substrate material, and/or to improve the developability of the photosensitive coating, as is described in the aforementioned U.S. Pat. No. 4,492,616. Thus, substrates 24, 44, and 84 will typically be treated (for example, by polyvinylphosphonic acid, silicate or by anodization, or by corona discharge or plasma treatment, or by roughening or gaining treatment) to promote desired adhesion of polymeric resist layers 22, 42, and 82.

Especially preferred substrates are the metallic substrates of aluminum, zinc, steel or copper. These include the known bi-metal and tri-metal plates such as aluminum plates having a copper or chromium layer; copper plates having a chromium layer; steel plates having copper or chromium layers; and aluminum alloy plates having a cladding of pure aluminum. Other substrates contemplated are silicon rubbers and metallized plastic sheets such as poly(ethylene terephthalate).

Preferred plates are the gained aluminum plates, where the surface of the plate is roughened mechanically or chemically (e.g., electrochemically) or by a combination of toughening treatments. Anodized plates can be used to provide an oxide surface. Anodization can be performed in an aqueous alkaline electrolytic solution, including, for example, alkali metal hydroxides, phosphates, aluminates, carbonates and silicates, as is known in the art. An aluminum plate, grained and/or anodized, which, for example, has been treated with polyvinylphosphonic acid or otherwise provided with a resinous or polymeric hydrophilic layer, can be suitably employed as a substrate.

Examples of printing plate substrate materials which can be used in the production of printing plates of the invention, and methods of graining and hydrophilizing such substrates are described, for example, in U.S. Pat. No. 4,153,461 (issued May 8, 1979 to G. Berghäuser, et al.); U.S. Pat. No. 4,492,616 (issued Jan. 8, 1985 to E. Pliefke, et al.); U.S. Pat. No. 4,618,405 (issued Oct., 21, 1986 to D. Mohr, et al.); U.S. Pat. No. 4,619,742 (issued Oct. 28, 1986 to E. Pliefke); and U.S. Pat. No. 4,661,219 (issued Apr. 28, 1987 to E. Pliefke).

When practicing the inventive methodology with the aforementioned microcapsule-based printing plate, the microcapsules will comprise at least a core material that is a good developer for the image layer and an impermeable wall material which physically separates the core from the imaging coat.

The microcapsules can be prepared by conventional coacervation processes, such as those set forth in U.S. Pat. Nos. 2,800,475, 2,800,458, 3,041,289, and 3,687,865. Also useful are interfacial polymerization processes, such as those set forth in U.S. Pat. Nos. 3,287,154, 3,492,380 and 3,557,515, U.K. Pat. Nos. 990,443, 1,046,409 and 1,091,141, Japanese Patent Publications Nos. 38(1963)-19574, 42(1967)-446, 42(1967)-771; in situ polymerization processes, such as those set forth in U.S. Pat. No. 4,001,140, U.K. Pats. Nos. 867,797 and 989,264; Japanese Patent Publication Nos. 12,380/62, 14,327/62, 29,483/70, 7,313/71 and 30,282/71; a process utilizing isocyanate-polyol wall material as that set forth in U.S. Pat. No. 3,795,669; a process of using isocyanate wall materials as described in U.S. Pat. No. 3,914,511; a process of using ureaformaldehyde-resorcinol wall forming material as described in U.S. Pat. Nos. 4,001,140, 4,087,376 and 4,089,802; a process of using melamine-formaldehyde resins, hydroxypropyl cellulose or the like as a wall forming material as described in U.S. Pat. No. 4,025,455; an electrolytic dispersion and cooling process as described in U.K. Pat. Nos. 952,807 and 965,074; and a spray-drying process as described in U.S. Pat. No. 3,111,407 and U.K. Pat. No. 930,422. Preferred microcapsules are those having a multi-layer wall around the core encapsulant. These can be made, for example, by forming a first, thin wall by an interfacial polymerization reaction, and subsequently forming a second, thicker wall by an in-situ polymerization reaction or by a coacervation process.

The first wall of the microcapsule will be typically comprised of polyurea, polyurethane, polyamide, polyester, epoxy-amine condensates and silicones. The second wall of the microcapsule is typically comprised of condensates of melamine-formaldehyde, urea-formaldehyde, resorcinol-formaldehyde, phenol-formaldehyde, gelatin-formaldehyde, or interpolymer complexes of two oppositely charged polymers such as gelatin/gum arabic and poly(styrene sulfonic acid)/gelatin.

Among the encapsulated developers that may be utilized in the microcapsules are γ-phenyllactone, γ-butyrolactone, ε-capralactone, δ-valerolactone, γ-hexalactone, δ-nonalactone, α-angelica lactone, 2-[2-(benzyloxy)ethyl]-5,5-dimethyl-1,3-dioxane, dimethylphthalate, dibutyl phthalate and other dialkyl phthalate, tricrecyl phosphate, esters of trimethylolpropane, 4-(p-acetoxyphenyl)-butan-2-one, triacetin, diesters of triacetin, diesters of triethylene glycol or tetraethylene glycol, derivatives of pyrollidone, N,N-dialkylacetamide, morpholine, trialkyl-1,1,2-ethane tricarboxylate, 4,4'-trimethylenebis (1-methylpiperidine), 4,4'-trimethylene bis (1-piperidineethanol), N,N-dimethylaniline, 2,6-dialkyl-N,N-dimethylaniline, alkylbenzene sulfonamide, 3-phenoxy-1,2-propanediol, phenethyl isobutyrate, triesters of glycerin, dialkyl adipate, alkoxybiphenyl.

Preferred encapsulants are high-boiling point, low vapor pressure, water insoluble solvents and cosolvents such as dimethylphthalate, dibutylphthlate, dioctylphthalate, tricrecylphosphate 4-(p-acetoxyphenyl)-butan-2-one, δ-nonalactone, triesters of glycerin, trimethylol-propane or pentaerithriol, N,N-dialkylaniline derivatives, γ-pbenylactone, toluenesulfonamide derivatives, alkoxybiphenyl, and dialkyl adipate, tributyrin, benzylacetone, benzyl benzoate, cinnamyl acetate, diethyl adipate, phenyl acetate, trimethylolpropane triacetate, trimethylolpropane tripropionate, and trimethylolpropane triacrylate and trimethacrylate.

In preparing the microcapsules with high-boiling, water insoluble developers, it has been found that the developers may be encapsulated in the presence of the following: (1) an encapsulatable organic base, preferably a tertiary amine such as derivatives of N,N-dimethylaniline, piperidine, morpholine, and ethylene diamine; (2) an oil soluble surfactant or co-surfactant with an HLB of lower than 10, preferably between 3–8. The resulting capsules may be dispersed in the coating solutions comprising of (1) a hydrophilic binder or combination of binders which are compatible with the inks and fountain solutions commonly used in the press operations, (2) a water soluble surfactant to facilitate wetting and leveling of the coating, (3) high-boiling, water soluble codevelopers to promote the dissolution of the binders in the fountain solution and the development efficiency of the developers released from the capsules. Examples of suitable water soluble binders include, but are not limited to, gum arabic, cellulose ethers, dextran sulfate, pectins, polyvinyl alcohol, polyvinyl pyrrolidone, polyvinylphosphonic acid, polystyrene sulfonic acid, polyacrylic acid and their copolymers. Examples of water soluble co-developers in the coating formulation include, but are not limited to, urea, sugar, tetraethyleneglycol diacetate, triethylene diacetate, N,N,N',N'-tetrakis(2-hydroxyalkyl)ethylene diamine, trihydroxyhexane, triethanolamine, citric acid, N-alkylpyrrolidone, lithium salts, sodium bicarbonate and sodium bisulfate. Examples of surfactants include, but are not limited to, alkylphenol-ethylene oxide adducts such as Triton X-100, block copolymers of ethylene oxide and propylene oxide such as Pluronic L44, L64 and P65, dialkylester of sodium sulfosuccinic acid such as Aerosol OT, and silicone block copolymers such as Silwet surfactants.

Suitable methods for coating the microcapsule coating solution onto the substrate include an air knife coating method, a blade coating method, a brush coating method, a curtain coating method or a slot-and-slit coating method. These methods can be selected by one skilled in the art in view of the present disclosure.

The particle size of the microcapsule should be well-controlled in a narrow range, with the mean particle size failing between 1 to 20 microns, preferably between 6 to 14 microns. Too large a capsule will result in poor processability. In this regard, it is noted that a capsule larger than 14 microns can be ruptured easily by hand. On the other hand, too small a capsule may result in a poor release of developers on the press. The compressive force at the tip of the blanket in a printing press is generally in the range of 80 to 250 pli which is enough to rupture most of the capsules on a highly textured plate.

For embodiments of the present invention utilizing an overlying microcapsule layer 11, said layer should be prepared so as to reduce scattering of the actinic radiation and thereby allow transmission of the actinic radiation to the underlying photosensitive layer. This is typically achieved by filling the microvoids or interstices among the microcapsules with water soluble binders, additives, or water re-dispersible latices which have about the same refractive indices as the microcapsules. Alternatively, the degree of light scattering by the microcapsule layer may also be reduced by applying a small amount of water or fountain solution onto the capsule layer immediately before the exposure step.

The present invention will now be described in further detail by the following non-limiting examples of several of its embodiments. Unless otherwise indicated, all parts, percents, ratios, and the like are by weight.

EXAMPLES

Preparation of TEMPO Substituted Poly(Ethylene-Maleic Acid, Potassium Salt)

Poly (ethylene-maleic anhydride) (7.4 g) is reacted with 4-aminoTEMPO (5 g) in water containing potassium carbonate (8 g) to give half substitution with TEMPO and half hydrolysis to potassium salt.

Preparation of Poly(Ethylene-Maleic) Acid, Potassium Salt) EMA-Hydrolyzed

Poly (ethylene-maleic anhydride) (5.66 g) was reacted with water (300 g) containing potassium carbonate (12.4 g) to give a solution of poly (ethylene-maleic acid, potassium salt).

Example 1

A photosensitive lithographic printing plate is overcoated with a microcapsule dispersion containing encapsulated diethyl adipate developer and TEMPO substituted poly (ethylene-maleic acid, potassium salt) as an aqueous phase thickener.

The photoresist composition used for the photosensitive lithographic printing plate is formulated as shown in the following Table 1-1.

TABLE 1-1

Preparation of Photoresist Formulation (3000 g. Batch)

| Component | % of Stock Solution | % in Dry Film | Gms. Stock Solution |
|---|---|---|---|
| Photoreactive Acrylic Binder[α] | 53 | 57.50 | 333.61 |
| Sartomer SR399 (dipentaerythritol pentaacrylate) | 20 | 32.89 | 505.65 |
| 3-benzoyl-7-methoxy coumarin | 2 | 1.60 | 246.00 |
| 4-benzoyl-4-methyl diphenyl sulfide | 3 | 1.80 | 184.50 |
| s-triazene[β] | 5 | 2.50 | 153.75 |
| Methyl Ethyl Ketone | | | 969.00 |
| Toluene | | | 161.55 |
| Cyclohexanene | | | 107.70 |
| LCV/BHT/1035 (2X) | 3.375 | 3.71 | 338.25 |
| Leuco Crystal Violet Dye (LCV) | 3 | 3.30 | |
| 2,6-di-tert-butyl-4-methyl phenol (BHT) | 0.22 | 0.24 | |
| Irganox 1035 (antioxidant from Ciba-Geigy) | 0.155 | 0.17 | |
| TOTAL | | 100.00 | 3000.00 |
| TOTAL SOLIDS | | | 307.50 |
| TOTAL SOLVENTS | | | 2692.50 |

Notes:
[α]: The photoreactive acrylic binder contains methyl methacrylate, butyl methacrylate, maleic anhydride, and TMI adduct with hydroxybutyl acrylate. See, U.S. patent application Ser. No. 08/147,045 and U.S. Pat. No. 5,514,522;
[β]: 2-[p-(n-heptylaminocarbonyl)phenyl]-4,6-bis (trichloromethyl)-1,3,5-triazine.

The microcapsule dispersion containing encapsulated diethyl adipate developer and TEMPO substituted poly (ethylene-maleic acid, potassium salt) is formulated as shown in the following Table 1-2.

TABLE 1-2

Preparation of Microcapsule Dispersion (30 g. Batch)

| Component | % Solids | Grams |
|---|---|---|
| Microencapsulated Developer (See, U.S. Pat. No. 5,516,620) | 33.85 | 15.92 |
| Sucrose | 15.00 | 0.42 |
| EMA-TEMPO | 3.06 | 7.93 |
| Pluronic F68 (block copolymer of propylene oxide and ethylene oxide) | 15.00 | 0.41 |
| Triton X 100 | 15.00 | 0.10 |
| Aerosol-OT (from Fisher) | 10.00 | 0.15 |
| Lithium Chloride | 5.00 | 1.22 |
| $H_2O$ | 0.00 | 4.00 |

The coated plate is then exposed to actinic radiation from a standard mercury halide lamp having an emission peak in the ultraviolet range at 360 nm. More particularly, the plate is exposed through a UGRA target mask at 8 light units (LU) to produce a test image. The plate is then developed with a Marathon subtractive developer, gummed with a protective finisher and stored under ambient conditions. The plate is subsequently placed on a Multigraphics Form printing press and ran in standard operation.

In samples treated as above, an exposure of 8 light units (LU) was noted to give shadow microline resolution of 20 g on a printed sheet.

Comparative Example 2

A formulation similar to that in Example 1 is coated on an aluminum substrate, except that the lithographic printing plate is overcoated with a microcapsule dispersion containing encapsulated diethyl adipate developer and poly (ethylene-maleic acid, potassium salt) as an aqueous phase thickener.

The microcapsule dispersion containing encapsulated diethyl adipate developer and poly (ethylene-maleic acid, potassium salt) is formulated as shown in the following Table 2-1.

TABLE 2-1

Preparation of Comparative Microcapsule Dispersion (30 g. Batch)

| Component | % Solids | Grams |
|---|---|---|
| Microencapsulated Developer (See, U.S. Ser. No. 08/146,710) | 33.85 | 15.92 |
| Sucrose | 15.00 | 0.42 |
| EMA-hydrolyzed | 2.20 | 7.93 |
| Pluronic F68 | 15.00 | 0.41 |
| Triton X 100 | 15.00 | 0.10 |
| Aerosol-OT (from Fisher) | 10.00 | 0.15 |
| Lithium Chloride | 5.00 | 1.22 |
| $H_2O$ | 0.00 | 4.00 |

The coated plate is then exposed to actinic radiation from a standard mercury halide lamp having an emission peak in the ultraviolet range at 360 nm. More particularly, the plate is exposed through a UGRA target mask at 8 light units (LU) to produce a test image. As in Example 1, the plate is then developed with Marathon subtractive developer, gummed with a protective finisher and stored under ambient conditions. The plate is placed on a Multigraphics Form printing press and ran in standard operation.

In samples treated as above, an exposure of 8 light units (LU) resulted in a shadow microline resolution of 40μ on a printed sheet.

Marathon Subtractive Developer is used to eliminate variability and deficiencies in the capsule development process. Accordingly, the crosslinked polymer gel image reveals the true resolution of the completely developed lithographic printing plate. The improved resolution on the printed sheet using the plate exposed through the microcapsule dispersion containing the TEMPO-substituted polymer (in comparison with the plate exposed through the microcapsule dispersion containing the non-TEMPO-substituted polymer) supports the position that free radical quenching groups of the polymer inhibit free radical cross-linking on the surface of the photoimaging layer, giving rise to an increase in resolution.

Preparation of EMA-ASA-TEMPO: TEMPO and 2-Aminoethyl Sulfonate Substituted Poly(Ethylene-Maleic Acid, Sodium Salt)

In a 4 L plastic beaker, a suspension of EMA (21.2 g) (from Zealand Chemical Co., approx. avg. $M_w$: 500,000; approx. avg. $M_n$: 100,000) in 1.8 kg of water is stirred at ambient temperature by means of a mechanical stirrer at 1000 rpm. A solution of 19.6 g 4-Amino-TEMPO, 4.8 g of 2-aminoethyl sulfonic acid (Taurine, available as Aldrich 15,224-2), and 6.2 g of sodium carbonate in water (200 g) is added over 2 minutes to control foaming. The beaker is covered. Stirring at ambient temperature is continued for 18 hours. A clear, yellow solution results. (1541.7 g, 2.89% solids, pH 6.5; calculated: 2048 g, 2.36% solids.) All operations are done under a fume hood. See, Synthesis Scheme I, supra.

Preparation of EMA-ASA: 2-Aminoethyl Sulfonate Substituted Poly(Ethylene-Maleic Acid, Sodium Salt)

Poly (ethylene-maleic anhydride) (8 g) was reacted with 2-aminoethyl sulfonic acid (7.9 g) in water (400 g) containing sodium carbonate (3.3 g) to give the sodium salt of the sulfate substituted poly (ethylene-maleic acid, sodium salt). See, Synthesis Scheme I, supra.

Example 3

A photosensitive lithographic plate comprising a photoresist is deposited on an anodized aluminum substrate, then overcoated with a 0.3 μm thick protective overcoat comprising 1:1 poly vinyl alcohol (Airvol 205 from Air Products) and EMA-ASA-TEMPO (See, pertinent "Preparation", supra). The formulation is prepared as shown in the following Table 3-1.

TABLE 3-1

Preparation of Comparative Overcoat Formulation (5 g. Batch)

| Component | % of Stock Solution | % in Dry Film | Gms. Stock Solution |
|---|---|---|---|
| EMA-ASA-TEMPO, Na | 1.40 | 45.00 | 3.21 |
| Polyvinyl alcohol (Airvol 205 from Air Products) | 3.00 | 45.00 | 1.50 |
| Pluronic L43 Surfactant (from BASF) | 5.00 | 4.00 | 0.08 |
| Sucrose | 10.00 | 2.00 | 0.02 |
| Aerosol OT | 10.00 | 2.00 | 0.02 |
| Triton X-100 | 10.00 | 2.00 | 0.02 |
| Water | — | — | 0.15 |
| TOTAL | — | 100.00 | 5.00 |

The photoresist (used @5.50% coating solution) is formulated as shown in the following Table 3-2.

TABLE 3-2

Preparation of Photoresist Formulation (80 g. Batch)

| Component | % of Stock Solution | % in Dry Film | Gms. Stock Solution |
|---|---|---|---|
| Acryloid Resin A-11 (from Rohm and Haas) | 10 | 6.50 | 2.86 |
| Acryloid Resin B-72 (from Rohm and Haas) | 20 | 14.00 | 3.08 |
| Photoreactive Acrylic Binder$^\alpha$ Oligomer/Monomer | 20 | 15.00 | 3.30 |
| Ebecryl 8301 Oligomer (from Radcure) | 20 | 11.50 | 2.53 |
| SR 399 (from Sartomer) | 20 | 39.35 | 8.66 |
| Total Oligomer/Monomer | | 50.85 | |
| 3-benzoyl-7-methoxy coumarin | 2 | 1.40 | 3.08 |
| 4-benzoyl-4-methyl diphenyl sulfide | 3 | 1.80 | 2.64 |
| s-triazene$^\beta$ | 5 | 2.50 | 2.20 |
| Pluronic L43 Surfactant (from BASF) | 20 | 4.00 | 0.88 |
| Methyl Ethyl Ketone | | | 38.37 |
| Cyclohexanone | | | 7.56 |
| Bis OMLEV/BHT/1035 | 3.595 | 3.95 | 4.84 |
| Bis OMLEV$^x$ | 3 | 3.30 | |
| 2,6-di-tert-butyl-4-methyl phenol (BHT) | 0.44 | 0.48 | |
| Irganox 1035 | 0.155 | 0.17 | |
| (antioxidant from Ciba-Geigy) | | | |
| TOTAL | | 100.00 | 80.00 |
| TOTAL SOLIDS | | | 4.40 |
| TOTAL SOLVENTS | | | 75.60 |

Notes:
$\alpha$: The photoreactive acrylic binder contains methyl methacrylate, butyl methacrylate, maleic anhydride, and TMI adduct with hydroxybutyl acrylate. See, U.S. patent application Ser. No. 08/147,045 and U.S. Pat. No. 5,514,522;
$\beta$: 2-[p-(n-heptylaminocarbonyl)phenyl]4,6-bis (trichloromethyl)-1,3,5-triazine;
$x$: bis-(4-diethylamino-o-tolyl)-4-diethylamino phenylmethane.

The coated plate is then exposed to actinic radiation from a standard mercury halide lamp, the lamp having an emission peak in the ultraviolet range of 360 nm. In particular, the plate is exposed through a UGRA target mask at 10, 15, 20, and 25 light units (LU) to produce a test image. The plate is mounted on a Multigraphics Form printing press, subjected to 20 revolutions with fountain solution, then 10 more revolutions with fountain solution and ink, and then ran in standard printing operation.

In samples so treated, Impression #1 show full development. Impression #100, when read for photospeed and resolution, shows a shadow microline resolution of 20μ at exposures of 10 to 25 light units (LU).

Comparative Example 4

An image layer formulation similar to that in Example 3 is deposited on an aluminum substrate. A conventional PVA-containing barrier layer formulation is then deposited onto the image layer. The coated plate is imagewise exposed, then mounted and run on a Multigraphics Form printing press as in Example 3.

In samples so treated, Impression #1 shows partial development. Impression #100, when read for photospeed and resolution, shows a shadow microline resolution of 30μ at exposures of 10 to 20 light units (LU), and 40μ at 25 light units (LU).

Comparative Example 5

An image layer formulation similar to that in Example 3 is deposited onto an aluminum substrate. The lithographic printing plate is not overcoated. The plate is imagewise exposed, then mounted and run on a Multigraphics Form printing press as in Example 3.

In samples so treated, Impression #1 shows partial development. Impression #100, when read for photospeed and resolution, shows shadow microline resolution of 25μ at exposures of 10 to 15 light units (LU), and 40μ at 20 to 25 light units (LU).

Comparative Example 6

An image layer formulation similar to that in Example 3 is deposited onto an aluminum substrate. A solution containing 1:1 PVA (Airvol 205 from Air Products) and EMA-ASA is deposited onto the image layer at a thickness aim of 0.3μ. The overcoat solution is formulated as shown in the following Table 6-1.

TABLE 6-1

Preparation of Comparative EMA-ASA Overcoat Formulation (5 g. Batch)

| Component | % of Stock Solution | % in Dry Film | Gms. Stock Solution |
|---|---|---|---|
| EMA-ASA | 1.40 | 45.00 | 3.21 |
| Polyvinyl alcohol (Airvol 205 from Air Products) | 3.00 | 45.00 | 1.50 |
| Pluronic L43 Surfactant (from BASF) | 5.00 | 4.00 | 0.08 |
| Sucrose | 10.00 | 2.00 | 0.02 |
| Aerosol OT | 10.00 | 2.00 | 0.02 |
| Triton X-100 | 10.00 | 2.00 | 0.02 |
| Water | — | — | 0.15 |
| TOTAL | — | 100.00 | 5.00 |

The coated plate is imagewise exposed, then mounted and run on a Multigraphics Form printing press as in Example 3.

In samples so treated, Impression #1 shows partial development. Impression #100, when read for photospeed and resolution, shows shadow microline resolution of 55μ at exposures of 10 to 25 light units (LU).

The observations for samples prepared in the manner of Examples 3 to 6 are summarized as shown in the following Table OPD:

TABLE OPD

Summary of Observations in Examples 3 to 6

| Example Number | Exposure (LU) | Gel Max | Highlight Dots | Shadow Dots | Highlight Microlines | Shadow Microlines |
|---|---|---|---|---|---|---|
| Example 3 | 25 (air) | 1–4 | 90 | 40 | 10 | 25 |
| | 10 | 1–6 | 98 | 20 | 6 | 20 |
| | 15 | 2–7 | 98 | 20 | 4 | 20 |
| | 20 | 3–7 | 98 | 20 | 4 | 20 |
| | 25 | 3–8 | 98 | 20 | 4 | 20 |
| Example 4 | 25 (air) | 1–11 | 99 | 20 | 4 | 30 |
| | 10 | 5–12 | 99 | 20 | 4 | 30 |
| | 15 | 5–12 | 99 | 20 | 4 | 30 |
| | 20 | 6–11 | 99 | 20 | 4 | 30 |
| | 25 | 7–12 | 99 | 20 | 4 | 40 |
| Example 5 | 25 (air) | 4–8 | 90 | 50 | 12 | 70 |
| | 10 | 5–9 | 99 | 20 | 4 | 25 |
| | 15 | 7–10 | 99 | 20 | 4 | 25 |
| | 20 | 8–11 | 99 | 20 | 4 | 40 |
| | 25 | 9–12 | 99 | 20 | 4 | 40 |
| Example 6 | 25 (air) | 4–12 | 97 | 50 | 30 | 70 |
| | 10 | 7–13 | 98 | 40 | 6 | 55 |
| | 15 | 8–15 | 98 | 50 | 6 | 55 |
| | 20 | 6–15 | 98 | 50 | 6 | 55 |
| | 25 | 8–15 | 98 | 50 | 6 | 55 |

Poor shadow microline resolution is most indicative of false gel due to light scattering and intermixing. Table OPD shows the improved resolution on the printed sheet using the plate exposed through the overcoat containing the EMA-ASA-TEMPO polymer (in comparison to the plates exposed through the overcoat containing PVA alone, no overcoat, or the non-TEMPO polymer EMA-ASA) supports the hypothesis that free radical quenching groups of this polymer inhibit free radical crosslinking on the surface of the polymeric resist layer, giving rise to increase in resolution.

Preparation of Non-Microcapsule-Based On-Press Developable Lithographic Plates An on-press developable printing plate is prepared by depositing onto an aluminum substrate a resist formulation prepared in accordance with the recipes (Resist A and Resist B) set forth in the following Table RA-RB.

TABLE RA-RB

Preparation of Photoresist Formulation (% of Film Solids)

| Component | Resist-A | Resist-B |
|---|---|---|
| Acryloid Resin A-11 (from Rohm and Haas) | 6.50 | 6.50 |
| Acryloid Resin B-72 (from Rohm and Haas) | 14.00 | 14.00 |
| Photoreactive Acrylic Binder$^\alpha$ | 15.00 | 15.00 |
| Ebecryl 8301 Oligomer (from Radcure) | 7.00 | 11.50 |
| SR 399 (from Sartomer) | 48.05 | 39.35 |
| 3-benzoyl-7-methoxy coumarin | 1.40 | 1.40 |
| 4-benzoyl-4-methyl diphenyl sulfide | 1.80 | 1.80 |
| s-triazene$^\beta$ | 2.50 | 2.50 |
| Pluronic L43 Surfactant (from BASF) | 4.80 | 4.00 |
| Leuco Crystal Violet Dye | 3.30 | 3.30 |
| 2,6-di-tert-butyl-4-methyl phenol (BHT) | 0.48 | 0.48 |
| Irganox 1035 (antioxidant from Ciba-Geigy) | 0.17 | 0.17 |

Notes:
$\alpha$: The photoreactive acrylic binder contains methyl methacrylate, butyl methacrylate, maleic anhydride, and TMI adduct with hydroxybutyl acrylate. See, U.S. patent application Ser. No. 08/147,045 and U.S. Pat. No. 5,514,522;
$\beta$: 2-[p-(n-heptylaminocarbonyl)phenyl]-4,6-bis (trichloromethyl)-1,3,5-triazine.

Example 7

An overcoat formulation containing 94% polyvinylalcohol (PVA 205 or 603) 2.5% sucrose, 2.5% Pluronic L43, and 1% TX-100 is coated (coating thickness~0.32 μm) onto printing plates having thereon either Resist-A or Resist-B. Control plates are left "uncoated".

A standard "toner test" using du Pont Cromalin 4/C Magenta Toner is then conducted. The toner is spread over a plate using a soft cotton pad, with excess toner being wiped off. Control plates are not treated with toner. A densitometer set on magenta is used to read the toner dye density.

Under evaluation, the control plates show a dye density of approximately 1.4 to 1.57 ("tacky"). In comparison, coated plates show dye densities of approximately 0.6. A reading of 0.6 is at $D_{min}$ of the printing plate, indicating no toner pickup and hence no tack.

Example 8

An overcoat formulation containing 90% polyvinyl alcohol (PVA 603), 2% sucrose, 4% Pluronic L43, 2% Aerosol OT, and 2% TX-100 is coated (coating thickness~0.32 μm) onto printing plates having thereon Resist-A. Control plates are left "uncoated".

The plates are then evaluated for photospeed. The evaluation is tabulated in the following Table 8-1.

TABLE 8-1

Resolution of Plates With And Without Overcoats After 100 Impressions.

| | With PVA Overcoat | | | | | | Without PVA Overcoat | | | | | |
|---|---|---|---|---|---|---|---|---|---|---|---|---|
| LU | $G_{max}$ | $G_{min}$ | Hi | Sh | Hiμ | Shμ | $G_{max}$ | $G_{min}$ | Hi | Sh | Hiμ | Shμ |
| 4 | 8 | 14 | 98 | 20 | 4 | 25 | 1 | 7 | 98 | 10 | 4 | 20 |
| 8 | 10 | 15 | 98 | 20 | 4 | 25 | 2 | 8 | 98 | 10 | 4 | 20 |
| 12 | 11 | 16 | 98 | 20 | 4 | 30 | 3 | 9 | 98 | 10 | 4 | 20 |
| 16 | 13 | >16 | 98 | 30 | 4 | 40 | 4 | 9 | 98 | 10 | 4 | 25 |

TABLE 8-1-continued

Resolution of Plates With And Without Overcoats After 100 Impressions.

| | With PVA Overcoat | | | | | | Without PVA Overcoat | | | | | |
|---|---|---|---|---|---|---|---|---|---|---|---|---|
| LU | $G_{max}$ | $G_{min}$ | Hi | Sh | Hiµ | Shµ | $G_{max}$ | $G_{min}$ | Hi | Sh | Hiµ | Shµ |
| 20 | 12 | >16 | 98 | 30 | 4 | 55 | 4 | 10 | 98 | 20 | 4 | 25 |

Notes:
G: Gel;
Hi: Highlight;
Sh: Shadow;
µ: microline.

The faster photospeed for the sample with the PVA overcoat is reflected in the increase in the $G_{max}$ value by 7 steps at correspondent exposures.

Example 9

An overcoat formulation containing 90% polymeric quencher, 2% sucrose, 4% Pluronic L43, 2% Aerosol OT, and 2% TX-100 is coated onto printing plates having thereon Resist-A. Subsequent evaluation reveals lack of ink receptability ("blinding") on initial impressions. However, the plates are "clean" after 50 impressions. Resolution after 100 impressions is summarized in the following Table 9-1.

TABLE 9-1

Resolution Of Resist-A Plate Overcoated With Quencher Polymer After 100 Impressions.

| LU | $G_{max}$ | $G_{min}$ | Hi | Sh | Hiµ | Shµ |
|---|---|---|---|---|---|---|
| 2 | 2 | 4 | 90 | 20 | 10 | 25 |
| 3 | 3 | 5 | 98 | 10 | 6 | 20 |
| 4 | 4 | 6 | 98 | 10 | 6 | 20 |
| 5 | 4 | 7 | 98 | 10 | 6 | 20 |
| 6 | 5 | 7 | 99 | 20 | 4 | 25 |

Notes:
G: Gel;
Hi: Highlight;
Sh: Shadow;
µ: microline.

Examples 10A and 10B

For Example 10A, an overcoat formulation containing 90% PVA (PVA 603), 2% sucrose, 4% Pluronic L43, 2% Aerosol OT, and 2% TX-100 is coated onto printing plates having thereon Resist-A.

For Example 10B, an overcoat formulation containing 63% PVA (PVA 603), 27% polymeric quencher, 2% sucrose, 4% Pluronic L43, 2% Aerosol OT, and 2% TX-100 is coated onto printing plates having thereon Resist-A.

The resolution for Examples 10A and 10B are evaluated. The Evaluation is summarized in the Following Table 10AB-1.

TABLE 10 AB-1

Resolution of Plates With And Without Polymeric Quencher After 100 Impressions.

| Without Polymeric Quencher (Ex. 10A) | | | | | | | With Polymeric Quencher (Ex. 10B) | | | | | | |
|---|---|---|---|---|---|---|---|---|---|---|---|---|---|
| LU | $G_{max}$ | $G_{min}$ | Hi | Sh | Hiµ | Shµ | LU | $G_{max}$ | $G_{min}$ | Hi | Sh | Hiµ | Shµ |
| 0.5 | 4 | 8 | 98 | 20 | 4 | 20 | 2 | 1 | 4 | 98 | 20 | 4 | 20 |
| 1.0 | 6 | 10 | 98 | 20 | 4 | 25 | 3 | 2 | 6 | 98 | 20 | 4 | 20 |
| 1.5 | 7 | 11 | 98 | 20 | 4 | 25 | 4 | 3 | 7 | 98 | 20 | 4 | 25 |
| 2.0 | 7 | 12 | 98 | 20 | 4 | 30 | 5 | 4 | 7 | 98 | 20 | 4 | 25 |
| 2.5 | 7 | 12 | 98 | 20 | 4 | 30 | 6 | 4 | 8 | 98 | 20 | 4 | 30 |

Notes:
G: Gel;
Hi: Highlight;
Sh: Shadow;
µ: microline.

The resolution of the plate with an overcoat containing quencher gives sharper contrast and slightly better resolution. When values of $G_{max}$ and $G_{min}$ are plotted against run length, samples prepared in accordance with Example 10B drop several stops ($G_{max}$) after 500 impressions and remain the same after 5000 impressions. $G_{max}$ for samples prepared in accordance with Example 10A drop continuously from the start to impression #5000. Such results may be construed as indicating that the presence of the quencher polymer in the overcoat is effective in eliminating false gels in the image layer.

Example 11

Microcapsule-containing formulations (88% tributyrin microcapsules, 2% triethanolamine, 4% Methocel E4M cellulose (Dow Chemical); 1% Pluronic L43, 0.25% TX-100; 0.25% Aerosol OT, 1% LiCl, and 3.5% sucrose) are coated onto substrate-supported resists. After lamination, the resulting plates are immediately run on press without prior hand rubbing with fountain solution. All plates had a dirty background, except those utilizing sucrose. It is believed that the presence of sucrose in the microcapsule topcoat formulation enhances the removability of the overcoat, especially in non-imaged areas.

Examples 12A and 12B

For Example 12A ("Sucrose"), an overcoat formulation containing 90% PVA (PVA 603), 2% sucrose, 4% Pluronic L43, 2% Aerosol OT, and 2% TX-100 is coated onto printing plates having thereon Resist-A.

For Example 12B ("No Sucrose"), an overcoat formulation containing 91% PVA (PVA 603), 4% Pluronic L43, 3% Aerosol OT, and 2% TX-100 is coated onto printing plates having thereon Resist-A.

Plates prepared in accordance with Examples 12A and 12B are exposed 2, 4, 6, 8, and 10 LU (Light Units). Data at start and after 100 impressions is collected and summarized in the Following Tables 12-1 and 12-2.

TABLE 12-1

Resolution Of Example 12A Plates Before And After 100 Impressions.

| | W/Sucrose at "Start" | | | | | | W/Sucrose at Imp. #100 | | | | | |
|---|---|---|---|---|---|---|---|---|---|---|---|---|
| LU | $D_{max}$ | $D_{min}$ | Hi | Sh | Hiμ | Shμ | $D_{max}$ | $D_{min}$ | Hi | Sh | Hiμ | Shμ |
| 2 | 7 | 13 | 98 | 20 | 4 | 30 | 6 | 12 | 98 | 10 | 4 | 30 |
| 4 | 9 | 15 | 98 | 20 | 4 | 40 | 7 | 14 | 98 | 10 | 4 | 30 |
| 6 | 4 | >16 | 98 | 20 | 4 | 40 | 4 | 15 | 98 | 10 | 4 | 40 |
| 8 | 11 | >16 | 98 | 20 | 4 | 55 | 9 | 16 | 98 | 10 | 4 | 40 |
| 10 | 14 | >16 | 98 | 30 | 4 | 55 | 12 | >16 | 98 | 20 | 4 | 40 |

Notes:
Hi: Highlight;
Sh: Shadow;
μ: microline.

TABLE 12-2

Resolution Of Example 12B Plates Before And After 100 Impressions.

| | W/O Sucrose at "Start" | | | | | | W/O Sucrose at Imp. #100 | | | | | |
|---|---|---|---|---|---|---|---|---|---|---|---|---|
| LU | $D_{max}$ | $D_{min}$ | Hi | Sh | Hiμ | Shμ | $D_{max}$ | $D_{min}$ | Hi | Sh | Hiμ | Shμ |
| 2 | 10 | 14 | 98 | 20 | 4 | 40 | 9 | 13 | 98 | 20 | 4 | 40 |
| 4 | 12 | 15 | 98 | 20 | 4 | 40 | 11 | 14 | 98 | 20 | 4 | 40 |
| 6 | 13 | 16 | 98 | 30 | 4 | 40 | 12 | 15 | 98 | 20 | 4 | 40 |
| 8 | 13 | >16 | 98 | 30 | 4 | 40 | 12 | 16 | 98 | 20 | 4 | 30 |
| 10 | 14 | >16 | 98 | 30 | 6 | 70 | 12 | >16 | 98 | 30 | 4 | 55 |

Notes:
Hi: Highlight;
Sh: Shadow;
μ: microline.

As shown in the Tables 12-1 and 12-2, plates with sucrose give better resolution (especially in microline areas) both at start and after 100 impressions, indicating that the presence of sucrose crystals in the overcoat facilitates the on-press removal of the overcoat material.

Example 13

A hydrophobic photoresist was deposited, at a coverage of from 80 to 110 mg/ft$^2$, onto an 8 mil (0.2 mm) hydrophilic aluminum substrate that had been electrochemically grained, anodized and treated with polyvinylphosphonic acid. The photoresist (coated @5.50% solids from a solvent mixture of 88/12% of 2-propanone and cyclohexanone) is formulated as shown in the following Table 13-1.

TABLE 13-1

Preparation of Photoresist Formulation

| Component | Wt % in Dry Film |
|---|---|
| Acryloid Resin A-11 (from Rohm and Haas) | 12.00 |
| Acryloid Resin B-72 (from Rohm and Haas) | 0.00 |
| Photoreactive Acrylic Binder$^\alpha$ | 18.50 |
| Oligomer/Monomer | |
| Ebecryl 8301 Oligomer (from Radcure) | 6.97 |
| Dipentaerythritol pentacrylate, Sartomer SR399 | 47.88 |
| 3-benzoyl-7-methoxy coumarin | 1.40 |
| 4-benzoyl-4-methyl diphenyl sulfide | 0.00 |
| s-triazene$^\beta$ | 2.50 |
| Pluronic L43 Surfactant (from BASF) | 4.80 |
| 3,6-dioxaheptanoic acid (DHTA) | 2.00 |

TABLE 13-1-continued

Preparation of Photoresist Formulation

| Component | Wt % in Dry Film |
|---|---|
| 2-Propanone | — |
| Cyclohexanone | — |
| Bis OMLEV$^x$ | 1.98 |
| 2,6-di-tert-butyl-4-methyl phenol (BHT) | 0.48 |
| Irganox 1035 (antioxidant from Ciba-Geigy) | 0.17 |
| Leuco crystal violet | 1.32 |
| TOTAL | 100.00 |
| TOTAL SOLIDS | 5.50 |
| TOTAL SOLVENTS | 94.50 |

TABLE 13-1-continued

Preparation of Photoresist Formulation

| Component | Wt % in Dry Film |
|---|---|

Notes:
α: The photoreactive acrylic binder contains methyl methacrylate, butyl methacrylate, maleic anhydride, and TMI adduct with hydroxybutyl acrylate. See, U.S. patent application Ser. No. 08/147,045 and U.S. Pat. No. 5,514,522;
β: 2-[p-(n-heptylaminocarbonyl)phenyl]-4,6-bis (trichloromethyl)-1,3,5-triazine;
x: bis-(4-diethylamino-o-tolyl)-4-diethylamino phenylmethane.

The plate was then overcoated with a 0.25 μm thick protective overcoat. The overcoat formulation was prepared as shown in the following Table 13-2.

TABLE 13-2

Preparation of Overcoat Formulation

| Component | wt % in Dry Film |
|---|---|
| EMA-ASA-TEMPO, Na$^\alpha$ | 22.00 |
| Polyvinyl alcohol (Airvol 205 from Air Products) | 62.50 |
| Pluronic L43 Surfactant (from BASF) | 5.00 |
| Sucrose | 6.00 |
| Aerosol OT | 3.00 |
| Triton X-100 | 1.05 |
| Water | — |
| TOTAL | 100.00 |

The coated plate was aged in a 60° C. oven for 24 hours then exposed to actinic radiation from a standard mercury halide lamp, the lamp having an emission peak in the ultraviolet range of 362 to 365 nm. The photoexposed plate was then used on a lithographic printing press without additional processing, e.g., washing or gumming. A printing plate employing this formulation produced "clean" images relatively immediately (i.e., after a few printed pages).

We claim:

1. A method of preparing a lithographic printing plate on a lithographic printing press which comprises the steps of:

(a) providing a lithographic printing plate precursor element comprising, in order, a lithographic hydrophilic printing plate substrate, a layer of polymeric ink-receptive photoresist capable of being photohardened upon imagewise exposure to actinic radiation, and a layer of polymeric protective overcoat capable of being dissolved by, dispersed by, or permeated by a lithographic printing fluid supplied to said printing plate precursor element by means provided on said printing press for delivering a lithographic printing fluid to a lithographic printing plate; the overcoat comprising at least a hydrophilic polymer and a crystalline compound, the crystalline compound being a water or fountain soluble or dispersible oligo- or poly- saccharide;

(b) imagewise exposing the lithographic printing plate precursor element to actinic radiation through said photoresist and overcoat layer sufficiently to photoharden the photoresist in exposed regions and to provide a latent image in said photoresist layer;

(c) placing the lithographic printing plate precursor element, prior to or subsequent to said step of imagewise exposing the precursor element, onto a lithographic printing press equipped with said means for delivering a lithographic printing fluid to the lithographic printing plate precursor element thereon;

(d) delivering lithographic printing fluid from said fluid delivery means to said printing plate precursor element bearing said latent image, while said precursor element is placed on said printing press for conduct of a printing operation, the delivery of said printing fluid being sufficient to dissolve or permeate and remove said overcoat layer from said precursor element, and to permeate and remove from the precursor element nonexposed regions of said photoresist layer, thereby to bare the hydrophilic surface of said printing plate substrate, while exposed and photohardened ink-receptive regions of said photoresist remain on said substrate.

2. The method of claim 1, wherein the overcoat further comprises a second hydrophilic polymer, the second hydrophilic polymer being a polymeric quencher.

3. The method of claim 1, wherein the crystalline compound is sucrose.

4. The method of claim 3, wherein the hydrophilic polymer is polyvinyl alcohol.

5. The method of claim 1, wherein the hydrophilic polymer is poly(vinyl alcohol).

6. The method of claim 1, wherein said substrate is an anodized, grained aluminum substrate.

7. The method of claim 1, wherein said photoresist is deposited onto said substrate at a coverage of 70 to 150 mg/ft$^2$.

8. A method of preparing a lithographic printing plate on a lithographic printing press which comprises the steps of:

(a) providing a lithographic printing plate precursor element comprising, in order, a lithographic hydrophilic printing plate substrate, a layer of polymeric ink-receptive photoresist capable of being photohardened upon imagewise exposure to actinic radiation, and a layer of polymeric protective overcoat capable of being dissolved by, dispersed by, or permeated by a lithographic printing fluid supplied to said printing plate precursor element by means provided on said printing press for delivering a lithographic printing fluid to a lithographic printing plate; the polymeric protective overcoat being a solvent-coated oleophilic overcoat, the polymeric component thereof being soluble in lithographic ink;

(b) imagewise exposing the lithographic printing plate precursor element to actinic radiation through said photoresist and overcoat layer sufficiently to photoharden the photoresist in exposed regions and to provide a latent image in said photoresist layer;

(c) placing the lithographic printing plate precursor element, prior to or subsequent to said step of imagewise exposing the precursor element, onto a lithographic printing press equipped with said means for delivering a lithographic printing fluid to the lithographic printing plate precursor element thereon;

(d) delivering lithographic printing fluid from said fluid delivery means to said printing plate precursor element bearing said latent image, while said precursor element is placed on said printing press for conduct of a printing operation, the delivery of said printing fluid being sufficient to dissolve or permeate and remove said overcoat layer from said precursor element, and to permeate and remove from the precursor element nonexposed regions of said photoresist layer, thereby to bare the hydrophilic surface of said printing plate substrate, while exposed and photohardened ink-receptive regions of said photoresist remain on said substrate.

9. The method of claim 8, wherein said substrate is an anodized, gained aluminum substrate.

10. The method of claim 8, wherein said photoresist is deposited onto said substrate at a coverage of 70 to 150 mg/ft$^2$.

11. A method of preparing a lithographic printing plate on a lithographic printing press which comprises the steps of:

(a) providing a lithographic printing plate precursor element comprising, in order, a lithographic hydrophilic printing plate substrate, a layer of polymeric ink-receptive photoresist capable of being photohardened upon immagewise exposure to actinic radiation, and a layer of polymeric protective overcoat capable of being dissolved by, dispersed by, or permeated by a lithographic printing fluid supplied to said printing plate precursor element by means provided on said printing press for delivering a lithographic printing fluid to a lithographic printing plate; the polymeric protective overcoat being an emulsion comprising oleophilic polymeric particles in a hydrophilic polymeric matrix;

(b) imagewise exposing the lithographic printing plate precursor element to actinic radiation through said photoresist and overcoat layer sufficiently to photoharden the photoresist in exposed regions and to provide a latent image in said photoresist layer;

(c) placing the lithographic printing plate precursor element, prior to or subsequent to said step of imagewise exposing the precursor element, onto a lithogrpahic printing press equipped with said means for delivering a lithographic printing fluid to the lithographic printing plate precursor element thereon;

(d) delivering lithographic printing fluid from said fluid delivery means to said printing plate precursor element bearing said latent image, while said precursor element is placed on said printing press for conduct of a printing operation the delivery of said printing fluid being sufficient to dissolve or permeate and remove said overcoat layer from said precursor element and to permeate and remove from the precursor element non-exposed regions of said photoresist layer, thereby to bare the hydrophilic surface of said printing plate substrate, while exposed and photohardened ink-receptive regions of said photoresist remain on said substrate.

12. The method of claim 11, wherein said substrate is an anodized, grained aluminum substrate.

13. The method of claim 11, wherein said photoresist is deposited onto said substrate at a coverage of 70 to 150 mg/ft$^2$.

* * * * *